United States Patent [19]
Yoshioka et al.

[11] Patent Number: 6,074,487
[45] Date of Patent: Jun. 13, 2000

[54] UNIT FOR VAPORIZING LIQUID MATERIALS

[75] Inventors: Naoki Yoshioka; Seiji Ito, both of Kyoto, Japan

[73] Assignee: Shimadzu Corporation, Kyoto, Japan

[21] Appl. No.: 09/021,153

[22] Filed: Feb. 10, 1998

[30] Foreign Application Priority Data

| Feb. 13, 1997 | [JP] | Japan | 9-029446 |
| Feb. 13, 1997 | [JP] | Japan | 9-029447 |
| Apr. 28, 1997 | [JP] | Japan | 9-111535 |
| Apr. 30, 1997 | [JP] | Japan | 9-112751 |

[51] Int. Cl.$^7$ .................................................. C23C 16/00
[52] U.S. Cl. .................................... 118/726; 118/715
[58] Field of Search .......................... 118/715, 723 VE, 118/723 DC, 726; 156/345

[56] References Cited

U.S. PATENT DOCUMENTS

| 5,273,622 | 12/1993 | Jacobsen | 156/659.1 |
| 5,670,218 | 9/1997 | Baek | 427/576 |
| 5,776,254 | 7/1998 | Yuuki et al. | 118/725 |
| 5,779,804 | 7/1998 | Mikoshiba et al. | 118/726 |

*Primary Examiner*—Richard Bueker
*Assistant Examiner*—Erin Fieler
*Attorney, Agent, or Firm*—Armstrong, Westerman, Hattori, McLeland & Naughton

[57] ABSTRACT

The object of the invention is to provide a unit for vaporizing liquid materials which can adjust not only a mixing rate but also a concentration of the mixed liquid easily and accurately and which can effectively vaporize a large amount of the liquid material.

A unit for vaporizing liquid materials in accordance with the invention is for mixing a plurality of liquid materials and comprises a plurality of containers each of which contains a different liquid material which is made by dissolving a material into a solvent, a container exclusive for solvent which contains the same or the same kind of solvent used for the liquid materials, a liquid conveying means which conveys the liquid materials from the containers and the solvent from the container exclusive for solvent, and a vaporizing means which sprays the liquid materials and the solvent conveyed by the liquid conveying means and vaporizes the sprayed liquid materials and the sprayed solvent.

7 Claims, 20 Drawing Sheets

UNIT FOR VAPORIZING LIQUID MATERIALS

BACKGROUND OF THE INVENTION

1. Field of the Invention

This invention relates to a unit for vaporizing liquid materials, more particularly, to a unit for vaporizing liquid materials which is preferably used for supplying liquid materials for film formation to a semiconductor manufacturing unit.

2. Discussion of the Relevant Art

A process of forming a thin metal film on a base is indispensable for manufacturing semiconductor devices. Conventional process of forming a thin metal film is the PVD process (the Physical Vapor Deposition process) such as a vacuum deposition process or a sputtering process. However, the CVD process (the Chemical Vapor Deposition process or the Chemical Vapor Phase Growth process), especially the MOCVD process (the Metalorganic Chemical Vapor deposition process) has recently been well utilized. The MOCVD process is to vaporize a volatile metal organic compound to be formed into a thin film or a liquid of the metal dissolved into a solvent (hereinafter the above mentioned compound or the liquid will comprehensively be called a liquid material), to convey the vaporized liquid material to a surface of a base in a state of vapor and to separate out a thin film of the decomposition product by means of a reaction such as a pyrolysis. The MOCVD process is considered superior to the conventional processes in several points such as a film quality, a velocity of film formation and a step coverage.

A conventional unit for vaporizing liquid materials comprises a plurality of containers each of which contains a material dissolved into a solvent, a plurality of liquid conveying lines to gather the liquid materials from each containers to one place and a vaporizer to vaporize the liquid materials conveyed through the liquid conveying lines. With the arrangement of the above-mentioned conventional unit, the mixing rate of the liquid materials can be changed if a flow control valve is arranged in a liquid conveying line. However, in order to dilute or concentrate the mixed liquid material each containers should be dismantled one by one to change the mixing rate of the solvent and the liquid material. This makes it complicated to operate the unit. In addition, this kind of the liquid material is liquid under normal temperatures and pressures, and hydrolysis may take place if the liquid material is touched by atmospheric moisture when the container is opened. This makes it extremely difficult to handle the liquid material.

Upon changing the mixing rate of a solvent and a liquid material it sometimes happens that a predetermined mixing rate is not obtained accurately by just adjusting a flow of the liquid material proportionally to the mixing rate since each of the liquid materials practically has a different characteristics such as compressibility and viscosity.

It is known that conventional vaporizers have such an structure that a liquid material contained in a reservoir is pumped up by a constant amount with a pump, the liquid material is absorbed into a mesh-shaped heating element having a flash matrix structure, the heating element is heated so as to vaporize the liquid material, and the vaporized material is supplied together with carrier gas to a CVD unit for film formation.

In accordance with the vaporizers having the above-mentioned structure, however, if an amount of the liquid material pumped from the pump is increased so as to vaporize a large quantity of the liquid material, a heating element of the vaporizer is cooled by the pumped liquid material itself, resulting in deteriorating thermal efficiency. As a result, the amount of the liquid material to be vaporized can not be increased.

It is an object of the present invention to provide a unit for vaporizing liquid materials which can easily and precisely adjust not only a mixing rate but also a concentration of the mixed liquid and which makes it possible to effectively vaporize a large quantity of liquid material.

SUMMARY OF THE INVENTION

In order to accomplish the above-mentioned object the invention has adopted the following structure. A unit for vaporizing liquid materials in accordance with the invention is utilized for mixing a plurality of liquid materials and characterized by comprising a plurality of containers each of which contains a different liquid material which is made by dissolving a material into a solvent, a container exclusive for solvent which contains the same or the same kind of solvent used for the above-mentioned liquid materials, a liquid conveying means which conveys the liquid materials from the containers and the solvent from the container exclusive for solvent, and a vaporizing means which sprays the liquid materials and the solvent conveyed by the liquid conveying means and vaporizes the sprayed liquid materials and the sprayed solvent.

In accordance with the above arrangement, a mixing rate of the liquid materials and the solvent can be varied to any value. Because the mixing rate can be adjusted by just setting an appropriate quantity of the liquid material and the solvent to be conveyed from the containers. As a result, not only a mixing rate but also a concentration like degree of dilution can easily be adjusted without dismantling each containers one by one or opening the containers. This makes it possible to prevent the liquid material from causing hydrolysis and this also improves the operating efficiency and the quality of the film formed. Especially the above-mentioned effects can be much more valuable when the mixing rate or the concentration is varied while the unit is operating.

In addition, since the vaporizing means sprays and then vaporizes the liquid materials and the solvent, the liquid material and the solvent can be uniformly sprinkled in a wide range. As a result, it can effectively prevent the temperature of a heating element for vaporization from dropping off because the liquid material adheres densely to a small area. This makes it possible to vaporize a large amount of the liquid materials.

For making it possible to set an appropriate rate of the flow according to the characteristics of the liquid material such as the compressibility or the viscosity it is preferable that every one of the containers and the container exclusive for solvent has a liquid conveying means and a mixing rate of the liquid materials and the solvent is controlled by the liquid conveying means.

With this structure, the liquid conveying means can be operated under the condition where the flow is appropriately calibrated according to the mixing rate of the liquid materials and the solvent in consideration of the characteristics of the liquid materials such as the compressibility and the viscosity thereof. As a result, a precision of the mixing rate or the quality of film formed can be improved much more than the case where the flow is just adjusted proportionally to a mixing rate.

In this case, if the unit has such an arrangement that a plurality of vaporizing means are arranged downstream of each of the liquid conveying means and the liquid materials and the solvent are mixed after the liquid materials and the solvent pass through the vaporizing means, it is possible to set the condition of vaporization according to the temperature at which each of the liquid material vaporizes. Then the liquid material can be vaporized for certain under the optimum condition. As a result, appropriately mixed gas can be produced and the quality of the film formed can be improved.

If a flow is not required to be set at a very rigid value, the liquid materials and the solvent may be conveyed from the containers by a single liquid conveying means in order to simplify pipings.

In this case, it is preferable to arrange a mixer downstream of the liquid conveying means in order to mix the liquid materials and the solvent appropriately.

It is preferable to arrange a solvent conveying line to introduce the solvent from the container exclusive for solvent directly to the vaporizing means in order to clean the vaporizing means effectively.

It is effective that the vaporizing means comprises an ultrasonic sprayer and a vaporizer in order to make the vaporizing means compact and effective.

In this case, the ultrasonic sprayer is preferably embodied by arranging a vibration transferring element having a characteristics of chemical resistant to the liquid material on the upper face of the ultrasonic vibrator in order to effectively prevent the ultrasonic vibrator from getting damaged. In addition, it is preferable to arrange the ultrasonic sprayer apart from a heating space heated by the vaporizer because the ultrasonic vibrator easily gets damaged by heat.

A concrete embodiment of the vaporizing means may comprise a carrier gas introducing means for introducing carrier gas which conveys the liquid materials sprayed by the ultrasonic sprayer to an objective portion. It is effective that the ultrasonic sprayer and the carrier gas introducing means are arranged over the vaporizer so that the sprayed liquid materials move from upside to downside. In accordance with the above structure, the sprayed liquid materials are conveyed to the vaporizer by not only an energy of the carrier gas but also gravity. As a result, the amount of the carrier gas can be reduced in comparison with an arrangement where the ultrasonic sprayer is arranged under the vaporizer. This makes it possible to make the concentration of the liquid material in gas to be supplied to the CVD film formation unit high, resulting in speeding up the velocity of film formation for semiconductor. In addition, since the overall amount of the gas supplied to the CVD film formation unit can be reduced, a load of vacuuming in the CVD film formation unit can be decreased and a size of a vacuum pump can be downsized. Even if a flow of the liquid material supplied to the CVD film formation unit is to be increased or decreased, there is no need of changing the flow of the carrier gas and the flow can be maintained generally at the same value. As a result, it becomes easy to set a parameter of the flow of the the liquid material and the flow of the carrier gas.

It is effective to arrange the containers and the container exclusive for solvent under the liquid conveying means in order to make it efficient to convey liquid. In accordance with the above arrangement, if air bubbles might get mixed with the liquid material in the liquid conveying line, air bubbles naturally go upward and they can easily be discharged through the liquid conveying lines while initial operation. As a result of this, it is effectively prevented that the air bubbles remain in the pipes or the valves which constitute the liquid conveying lines and that the efficiency of conveying liquid is deteriorated. With the structure, if the vaporizer is arranged close to a reacting vessel, the vaporized gas can be conveyed quickly to the reacting vessel. As a result, the heating area after vaporization can be made small. This makes it possible to supply vaporized gas stably and to simplify the structure. This also makes it possible to arrange all of the elements in a single unit structure, which is easy to handle. Also effective liquid conveying performance and a good characteristics of film formation are obtained.

If the liquid conveying means is a plunger, it is preferable to provide a sliding portion of the plunger with a flow channel for flowing a cleaning solvent in order to effectively prevent a liquid material easy to hydrolyze from sticking to the surface of the plunger and being exposed to air. With this structure, it is effective to clean the sliding portion of the plunger if a cleaning solvent is introduced to the sliding portion of the plunger along the flow channel or a cleaning solvent is enclosed in the sliding portion and periodically exchanged. As a result, the liquid material sticking to the surface of the plunger is washed away and no product is produced on the surface of the sliding portion or any product which might be generated by chance can quickly be removed, thereby to prevent abrasion of the sliding portion of the plunger.

In this case, it is effective that a seal of the plunger is made of polytetrafluoroethylene (PTFE) with carbon fibrous material in order to prevent the plunger and the seal of the plunger which makes slidable movement to the plunger from progress of abrasion. With the above structure, the seal of the plunger is made of polytetrafluoroethylene integrally inclusive of carbon fibrous material. Then if the seal is used for the sliding portion of the plunger, carbon will not easily be stripped in a short term in comparison with a case that carbon is just mixed with polytetrafluoroethylene. As a result, progress of abrasion is effectively prevented and it is possible to maintain an effect of sealing in a long term if polytetrafluoroethylene with carbon fibrous material is used for a seal of the plunger pump which deals with liquid material easy to produce solid product, leading to less maintenance.

BRIEF DESCRIPTION OF THE DRAWINGS

The objects and features of the invention may be understood with reference to the following detailed description of illustrative embodiments of the invention, taken together with the accompanying drawings in which.

DESCRIPTION OF THE PREFERRED EMBODIMENT

Figure 1:
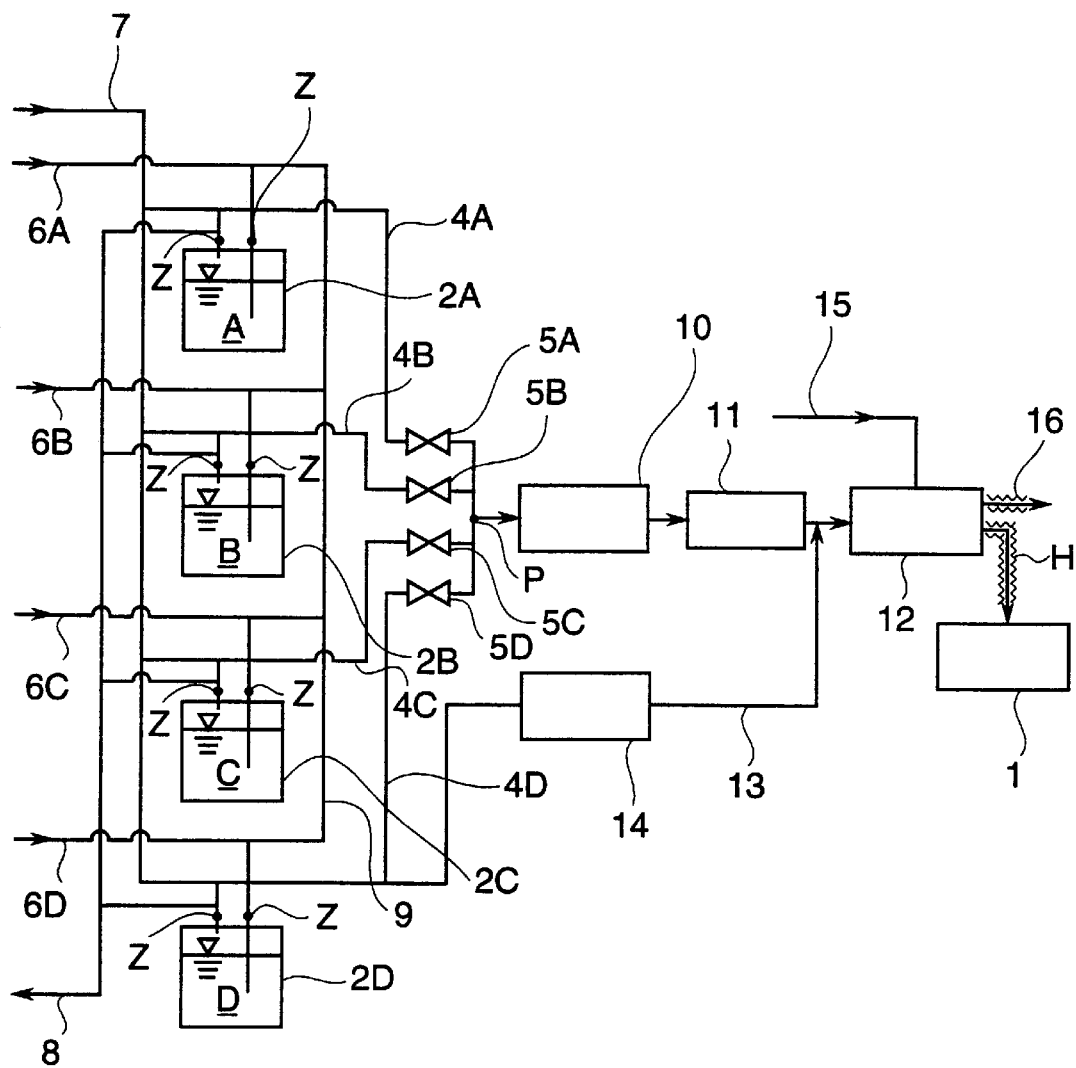
FIG. 1 is a circuit diagram showing a unit for vaporizing liquid materials in accordance with the first embodiment of this invention.
Figure 2:
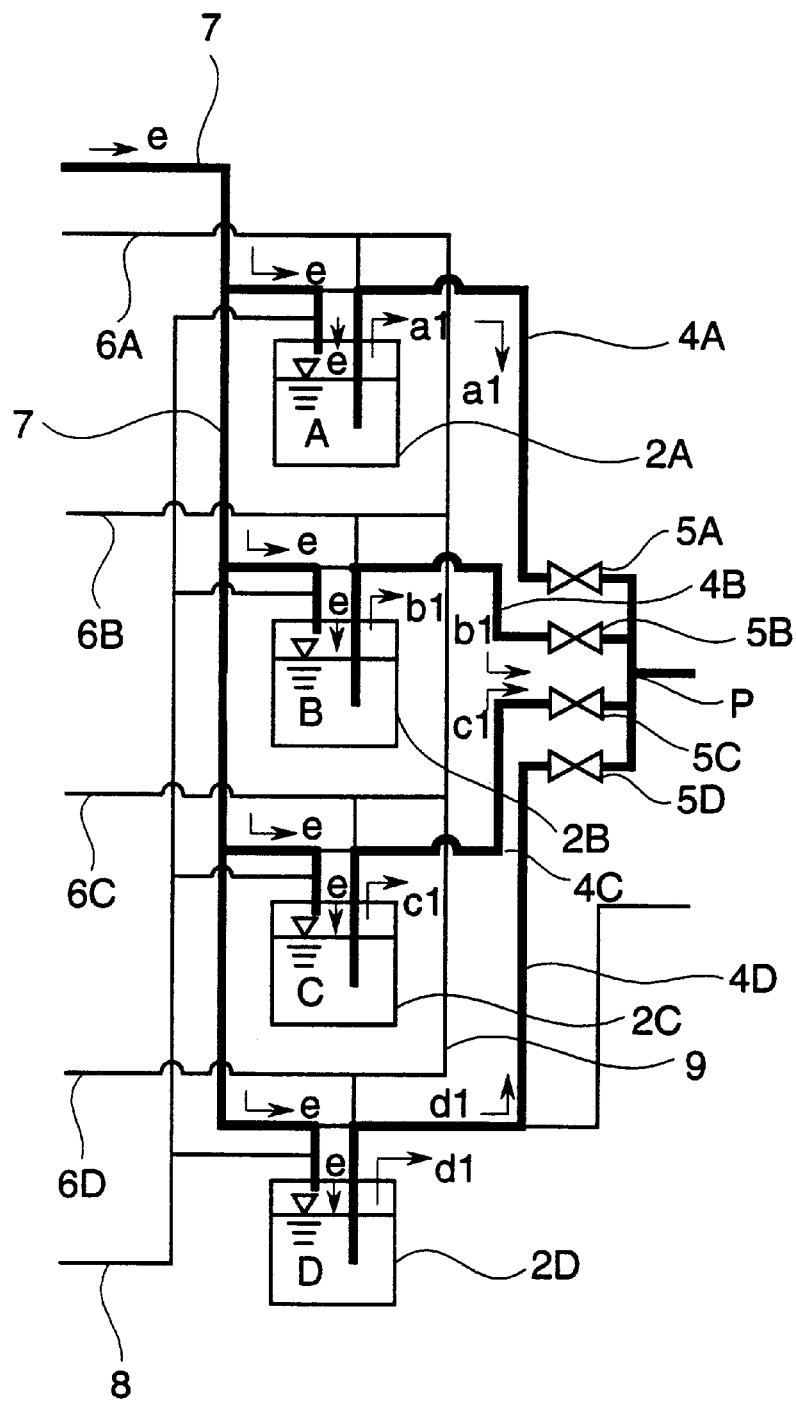
FIG. 2 is an explanatory view of an essential part of the circuit diagram.

Several embodiments of the invention will now be described below with reference to the drawings.

The First Embodiment

A unit for vaporizing liquid materials shown in FIG. 1 through FIG. 8 is to mix and vaporize a plurality of different liquid materials and supplies the mixed and vaporized liquid materials to a CVD reactor 1 which is one element of a CVD unit for film formation and comprises a plurality of containers 2A, 2B and 2C, a container exclusive for solvent 2D and liquid conveying lines 4A, 4B, 4C and 4D.

The containers 2A, 2B and 2C are filled with the liquid materials A, B, and C each of which is made by dissolving a given material into a common solvent in a predetermined proportion. The materials of the liquid materials A, B, and C are, for example, Pb, Zr and Ti for forming a strong dielectric thin film, Ba, Sr and Ti for forming a high dielectric thin film, and Bi, Sr and Cu for forming a super conduction thin film. It is needless to say that the total number of the containers may be two or four or more in accordance with the number of the kind of the materials. The container 2D exclusive for solvent is filled with a solvent D which is the same solvent that is used for the above-mentioned liquid materials A, B and C. The solvent D does not necessarily need to be the same as far as it has a common property and it does not produce any chemical effect on a CVD process.

Each of the conveying lines 4A, 4B, 4C and 4D is so arranged that one end of which is dipped into the liquid material A, B or C in the container 2A, 2B or 2C or the solvent D in the container 2D and the other end of which is gathered to meet at a meeting point P. Proportional valves 5A, 5B, 5C and 5D which can adjust a flow of the liquid materials A, B and C and the solvent D are arranged upstream of the meeting point P. In this embodiment the liquid conveying lines 4A, 4B, 4C and 4D, external supplying lines 6A, 6B, 6C and 6D, a purging line 7, a vacuum line 8 and a solvent by-pass line 9 share common pipes as far as possible, and around the contact points of the pipes a plurality of valves (omitted to show in the drawings) are arranged. The liquid conveying lines 4A, 4B, 4C and 4D are to convey the liquid materials A, B, C and the solvent D from the containers 2A, 2B, 2C and 2D to the meeting point P along the arrows a1, b1, c1 and d1 shown in FIG. 2 by switching the required valve.

Figure 3:
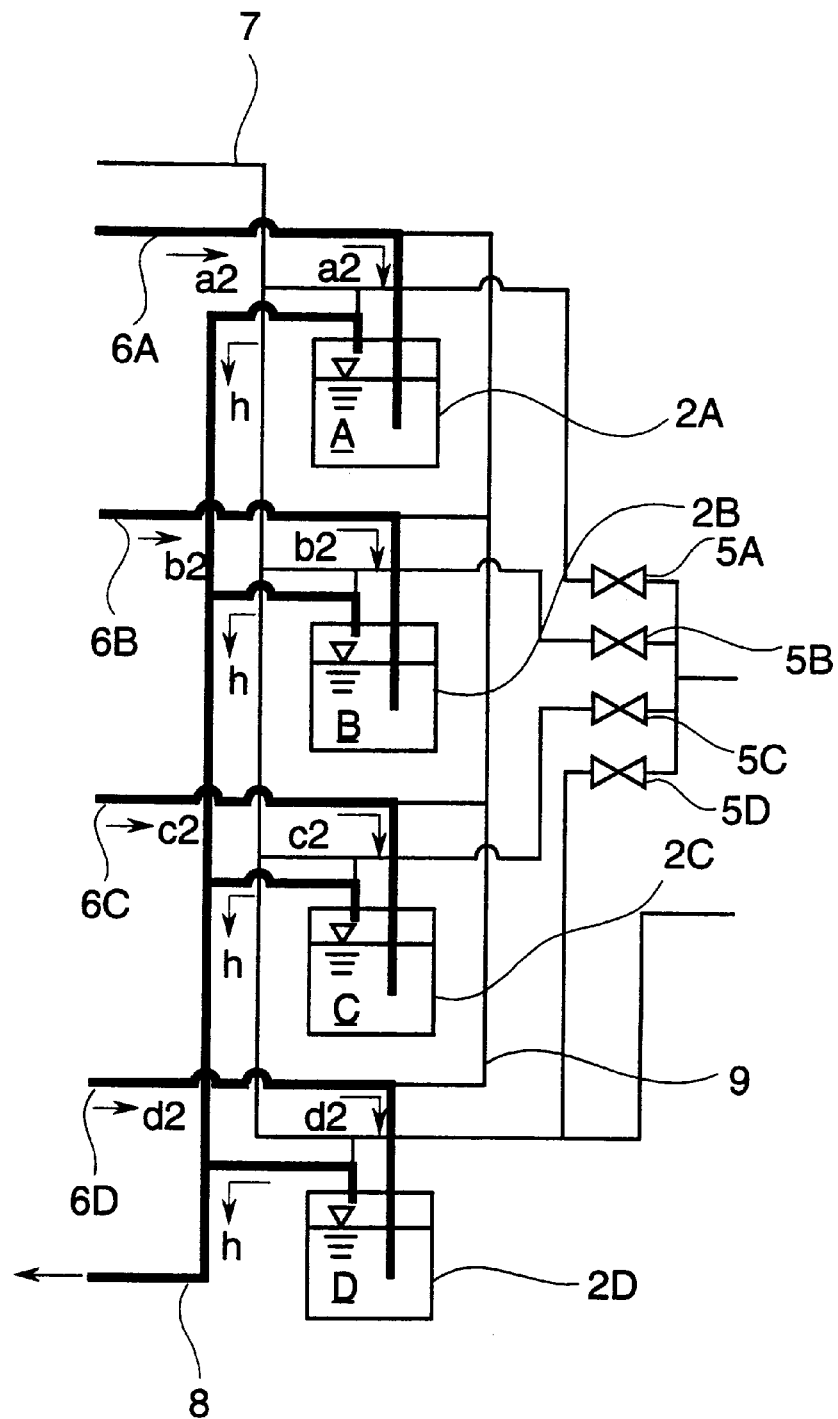
FIG. 3 is an explanatory view of an essential part of the circuit diagram.
Figure 4:
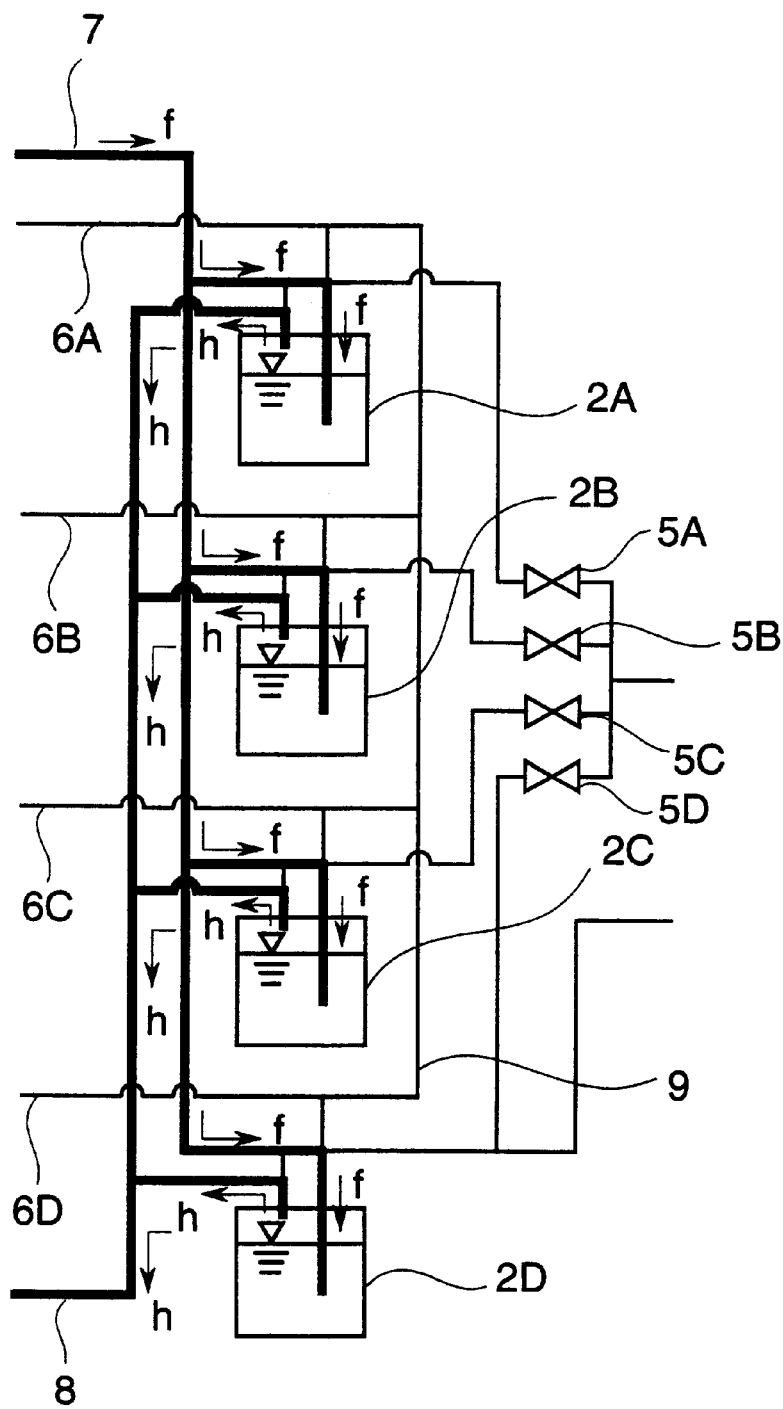
FIG. 4 is an explanatory view of an essential part of the circuit diagram.

The external supplying lines 6A, 6B, 6C and 6D are to fill and replenish the liquid materials A, B and C and the solvent D from sources of supply (out of the diagram) to the inlet side of the containers 2A, 2B, 2C and 2D along the arrows a2, b2, c2 and d2 shown in FIG. 3 by means of the operation of switching the required valves.

The purging line 7 is to pressurize the liquid level in the containers 2A, 2B, 2C and 2D for conveying the liquid material or to conduct a purging in the containers 2A, 2B, 2C and 2D and surrounding pipes. Inert gas such as $N_2$ or Ar is supplied to the containers 2A, 2B, 2C and 2D along the arrow e shown in FIG. 2 for pressurizing the liquid level. For purging the containers 2A, 2B, 2C and 2D and pipes of the inlet side of the containers 2A, 2B, 2C and 2D inert gas is introduced into the outlet side of the containers 2A, 2B, 2C and 2D from a source supply of inert gas along the arrow f shown in FIG. 4. For purging pipes of the inlet and outlet sides of the containers 2A, 2B, 2C and 2D inert gas is introduced directly into the proportional valves 5A, 5B, 5C and 5D through the outlet side of the containers 2A, 2B, 2C and 2D from the inlet side of the containers 2A, 2B, 2C and 2D along the arrow g shown in FIG. 5.

The vacuum line 8 is to vacuum the containers 2A, 2B, 2C and 2D and the surrounding pipes. The containers 2A, 2B, 2C and 2D are vacuumed by a vacuum pump (omitted to show in the drawings) along the arrow h shown in FIG. 3 and FIG. 4. The surrounding pipes arranged upstream the proportional valves 5A, 5B, 5C and 5D are vacuumed by opening all of the valves around each contact points on the circuit.

Figure 6:
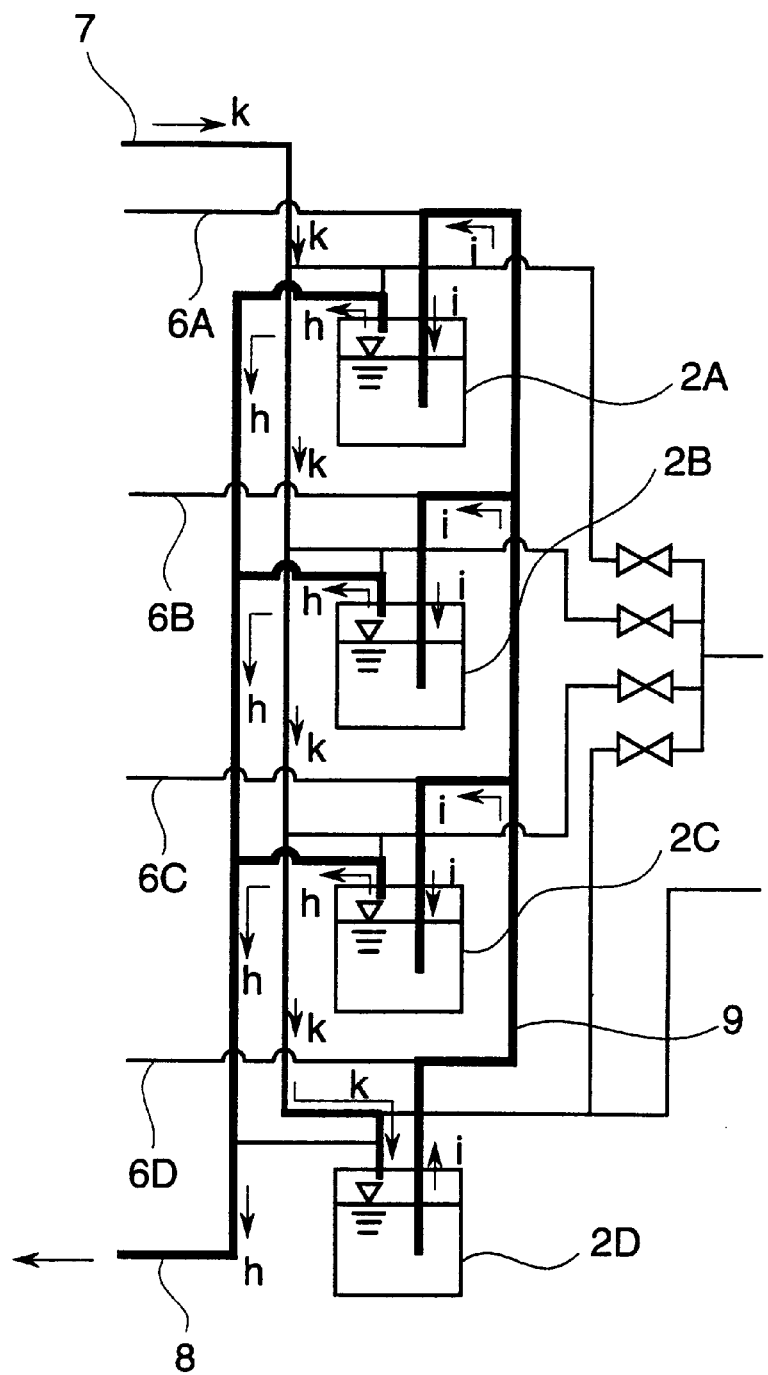
FIG. 6 is an explanatory view of an essential part of the circuit diagram.
Figure 7:
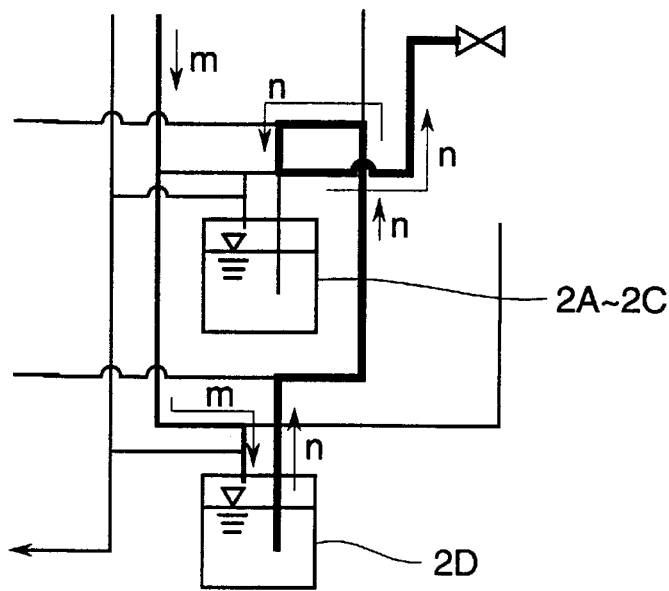
FIG. 7 is an explanatory view of an essential part of the circuit diagram.
Figure 8:
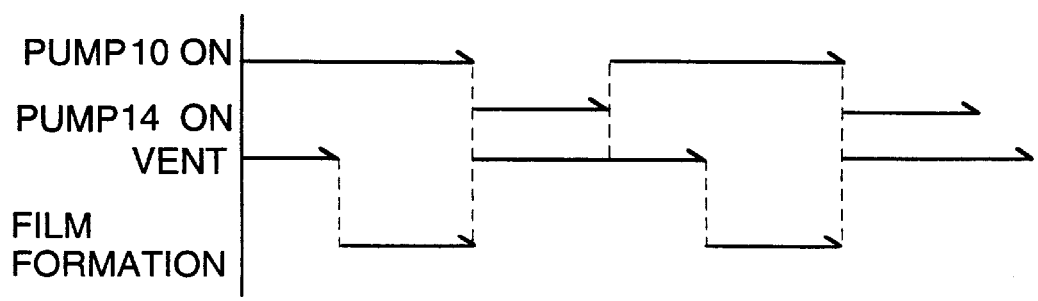
FIG. 8 is a time chart showing a state of operation of the embodiment.

The solvent by-pass line 9 is to conduct solvent cleaning in pipes of downstream the containers 2A, 2B, 2C and 2D by conveying the solvent D introduced from the container 2D to the container 2A, 2B and 2C along the arrow i shown in FIG. 6. In this case the containers 2A, 2B and 2C is evacuated through the vacuum line 8 along the arrow h and the container 2D is pressurized through the purging line 7 along the arrow k.

The unit for vaporizing liquid materials shown in FIG. 1 has such an arrangement that downstream the meeting point P provided are a pump 10 as a liquid conveying means having a function of controlling a flow of liquid, a mixer 11 for mixing the liquid materials A, B and C and a vaporizer 12 for vaporizing the liquid materials A, B and C and the mixed and vaporized gas which has passed through all of the above-mentioned pump 10, mixer 12 and vaporizer 12 is supplied to the CVD reactor 1. The pump 10 is an in-line double plunger pump with low pulsation and high accuracy.

The pump 10 has such an arrangement that each liquid materials A, B and C or the solvent D is inhaled by the amount to meet a predetermined mixing rate by the plunger while the plunger makes one stroke with each of the proportional valve 5A, 5B, 5C or 5D opening one by one in succession for a given duration. All of the flow is controlled by the pump 10 according to the number of driving revolutions of the plunger.

The container 2D has such an arrangement that the solvent D is conveyed directly to the inlet of the vaporizer 12 through a solvent conveying line 13 and an auxiliary pump 14 separately provided for cleaning the vaporizer 12. Inert carrier gas can be introduced into the vaporizer 12 from external source of supply through a carrier gas introducing line 15.

Then a method of operating the unit in accordance with this embodiment will now be explained. First, connect the inlet and outlet sides of the each empty containers 2A, 2B, 2C and 2D to a suitable pipe through a joint z. Next, open all of the valves to operate the vacuum line 8 and vacuum the containers 2A, 2B, 2C and 2D and all pipes. Then fill the liquid material A, B and C to the containers 2A, 2B and 2C and the solvent D to the container 2D along the arrow a2, b2, c2 and d2 shown in FIG. 3. Finally, operate the pump 10 and introduce inert gas into the inlet side of the containers 2A, 2B, 2C and 2D along the purging line 7 showed by the arrow e in FIG. 2 so as to pressurize the liquid level, then the liquid materials A, B and C and the solvent D filled in the containers 2A, 2B, 2C and 2D are pushed to the liquid conveying line 4A, 4B, 4C and 4D as shown by the arrow a1, b1, c1 and d1 and gathered to meet at the meeting point P through proportional valves 5A, 5B, 5C and 5D with a predetermined mixing rate. The mixing rate can be varied by changing the setting of the proportional valves 5A, 5B, 5C and 5D even if the unit for vaporizing liquid materials is under operation. Thus made mixed liquid passes the pump 10 shown in FIG. 1 and is mixed uniformly by the mixer 11 and then vaporized by the vaporizer 12. The vaporizer 12 is provided with a vent line 16. The mixed gas is supplied to the CVD reactor 1 only while film is formed as shown in the time chart of FIG. 8 and vented during an interval of the film formation. For cleaning inside of the vaporizer 12 set the pump 10 OFF and the pump 14 ON during the interval so as to convey the solvent D directly to the vaporizer 12 through the liquid conveying line 13.

As mentioned above, in accordance with the embodiment not only a mixing rate of the liquid materials A, B and C but also a rate of the solvent D in a mixed liquid, namely a concentration of the material can be varied at any discretion by adjusting the proportional valves 5A, 5B, 5C and 5D to meet a requirement. As a result, there is no need of dismantling the containers 2A, 2B, 2C and 2D from the joints z in order to dilute the mixed liquid, thereby to improve efficiency in operation. Especially the unit in accordance with this embodiment is very useful to meet a recent demand of changing a mixing rate or a degree of dilution during an operation of film formation. In addition since the mixer 11 is arranged downstream of the meeting point P of the liquid conveying lines 4A, 4B, 4C and 4D, the liquid materials A, B, C and D are uniformly mixed by the mixer 11. Then the quality of the mixed gas to be used for film formation becomes excellent, thereby to improve the preciseness of film to be formed. When a vaporization temperature and a decomposition temperature of a liquid material are almost the same, some decomposition product may be produced because of the residue of the liquid material remaining in the vaporizer 12. However, in accordance with the embodiment, every time after the operation of film formation inside the vaporizer 12 is cleaned by being connected to the vent line 16 and introducing solvent D through the solvent conveying line 13. This can effectively prevent generation of decomposition product, thereby to avoid deterioration of film quality. The unit in accordance with the embodiment has such a simple arrangement that pipes are commonly used by various pipe lines and that there is only one pump 10 and one vaporizer 12, resulting in reducing the cost. In addition, the unit becomes easy to maintain.

Figure 5:
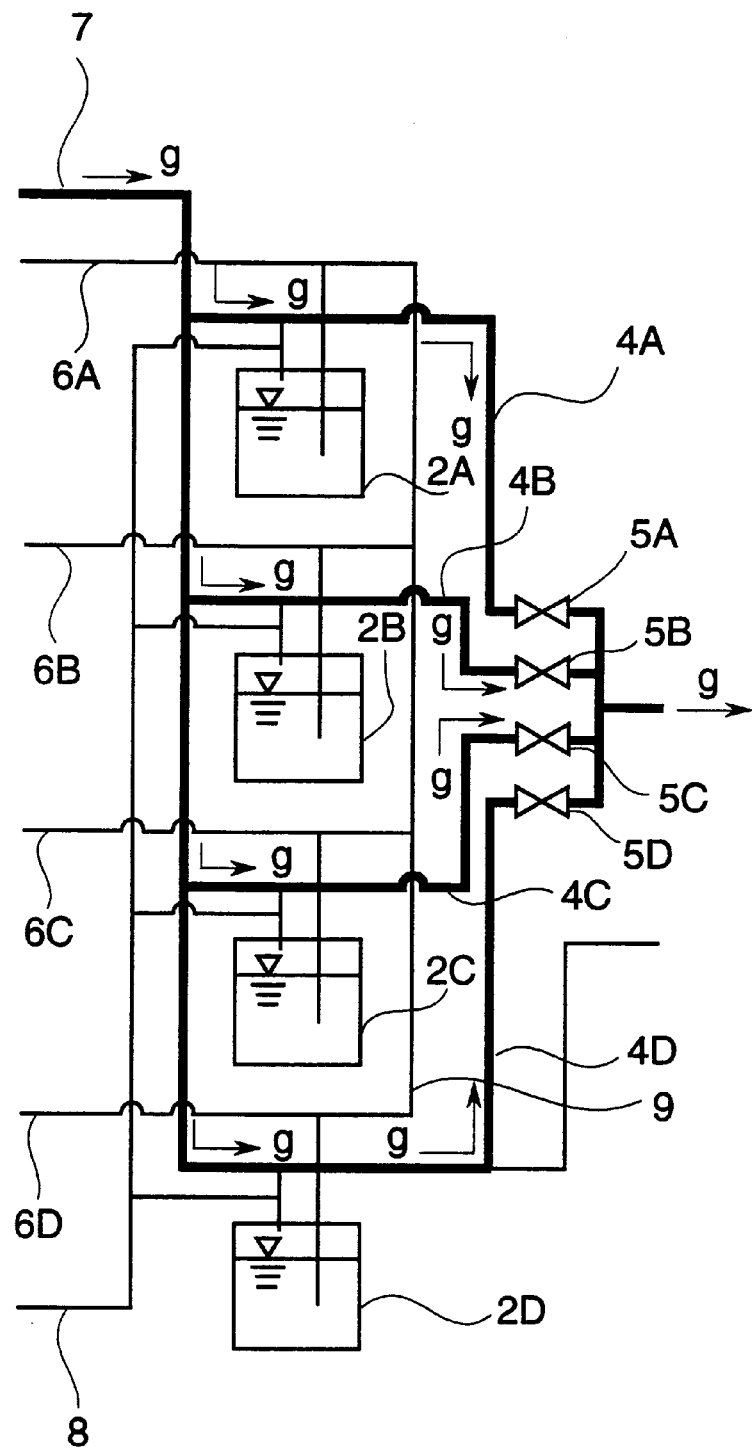
FIG. 5 is an explanatory view of an essential part of the circuit diagram.

In addition to the above operation, if the purging line 7 is arranged as shown by the arrow a in FIG. 5, liquid in the pipes downstream of the containers 2A, 2B, 2C and 2D can be removed without removing the liquid from the containers 2A, 2B, 2C and 2D. For dismantling one or all of the containers 2A, 2B, 2C and 2D to exchange liquid, the purging line 7 is arranged as shown by the arrow f in FIG. 4 and the vacuum line 8 is arranged as shown by the arrow h so as to purge the liquid material existing around the joints z of the containers 2A, 2B, 2C and 2D. Since some liquid material remaining in the pipes around the joints z may cause hydrolysis, it is required to remove the remaining liquid materials from the pipes perfectly. In order to remove the liquid, the liquid level of the container 2D is to be pressurized through the purging line 7 shown by the arrow k in FIG. 6 so as to introduce the solvent D into the containers 2A, 2B and 2C through a solvent by-pass line 9 shown by the arrow i. For maintaining the pump 10 or valves 5A, 5B and 5C, the liquid level of the container 2D is to be pressurized along the arrow m in FIG. 7 so as to introduce the solvent D to surrounding pipes along the arrow n.

This shows only one example of the methods of operating the embodiment and other different operation of purging or vacuuming can be conducted by means of switching required valves. The valves may be automatically controlled or mass flow controller may be used in stead of the pump.

The Second Embodiment

Figure 9:
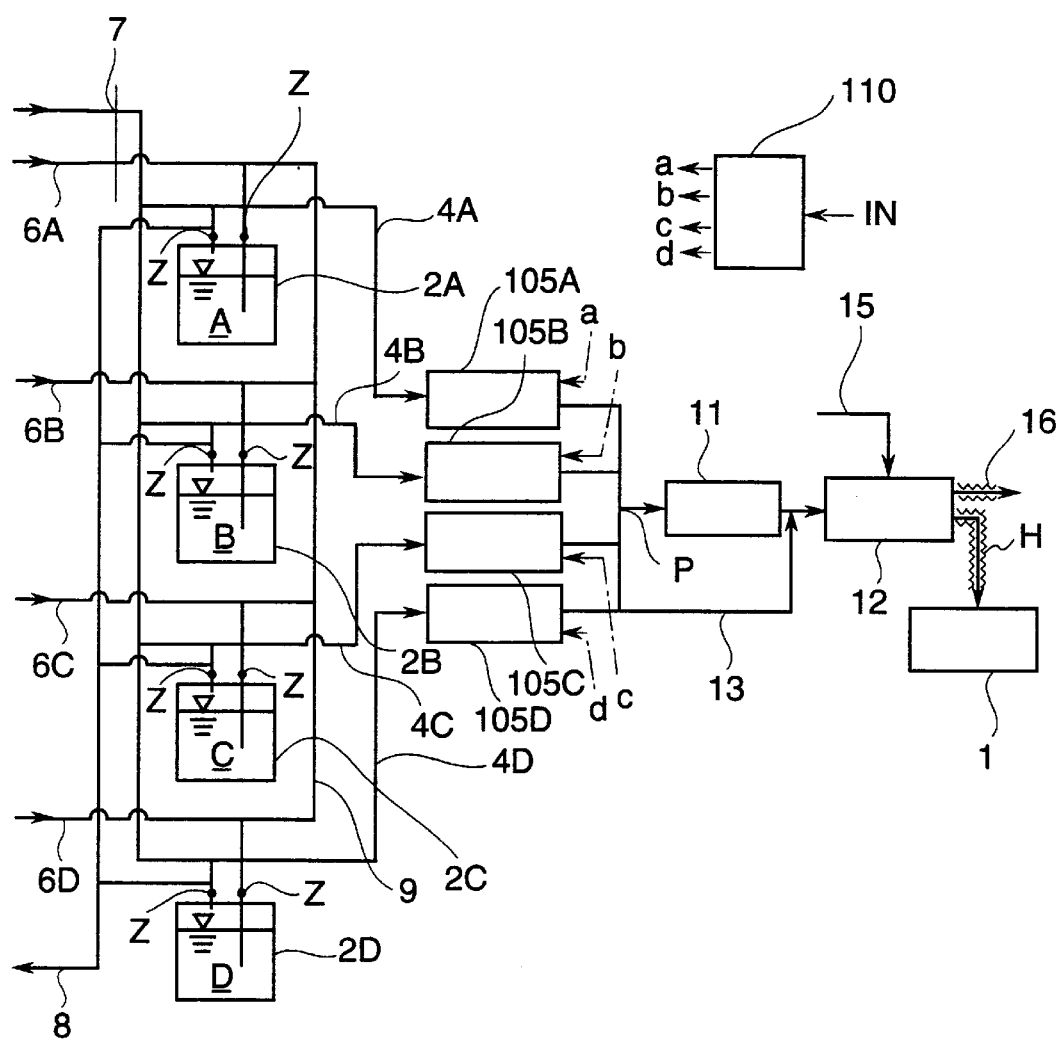
FIG. 9 is a circuit diagram showing a unit for vaporizing liquid materials in accordance with the second embodiment of the invention.

The embodiment shown in FIG. 9 is essentially the same as the above-mentioned first embodiment except that pumps 105A, 105B, 105C and 105D as a liquid conveying means are arranged for every one of the containers A, B, C and D, that no pump is arranged downstream of a meeting point P, and that each of the pumps 105A, 105B, 105C and 105D is controlled by a controller 110.

The pumps 105A, 105B, 105C and 105D are in-line or parallel double plunger pump with low pulsation and high accuracy which can adjust a flow of liquid according to the number of driving revolution of the plunger. The controller 110 inputs controlling signals a, b, c and d to each of the pumps 105A, 105B, 105C and 105D. The controller has such an arrangement that a mixing rate and a flow are input as data IN and the controlling signals a, b, c and d are output according to the calibrated flow to meet the required amount depending on the compressibility or viscosity of the liquid material. Both of the fundamental operation of switching valves and the liquid flow are the same as those of the first embodiment and no description will be given.

Figure 10:
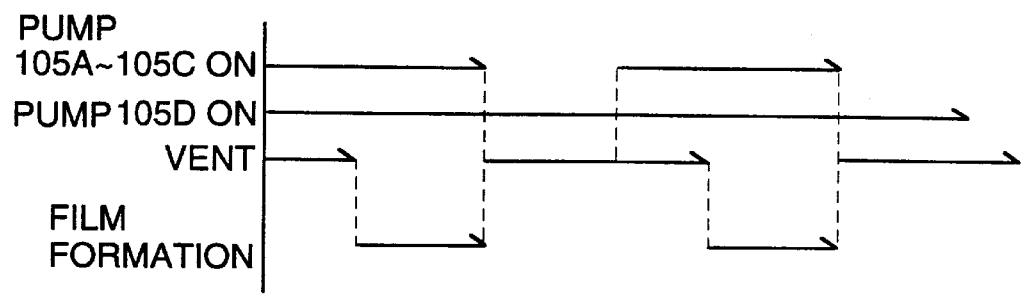
FIG. 10 is a time chart showing a state of operation of the embodiment.

In accordance with the embodiment, since each of the pumps 105A, 105B, 105C and 105D is operated under the condition where the flow is appropriately calibrated according to the mixing rate of the liquid material A, B and C and the solvent D based on the compressibility and the viscosity thereof, the precision of the mixing rate or the concentration of the mixed gas can be much improved than the case where the flow is just adjusted proportionally to an initially set mixing rate. In addition, since the mixing rate and the concentration can be controlled during the operation of film formation, the unit can satisfy a requirement of varying a mixing rate or a dilution rate during an operation of film formation. FIG. 10 is a time chart showing a timing of film formation and ventilation.

Figure 11:
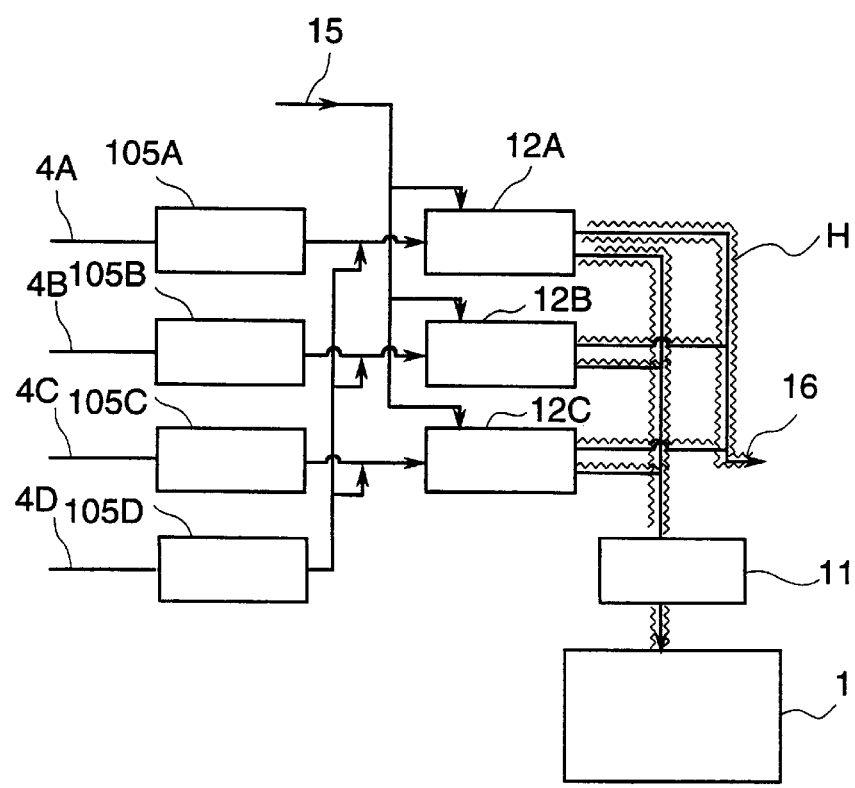
FIG. 11 is a circuit diagram showing a modification of FIG. 9.
Figure 12:
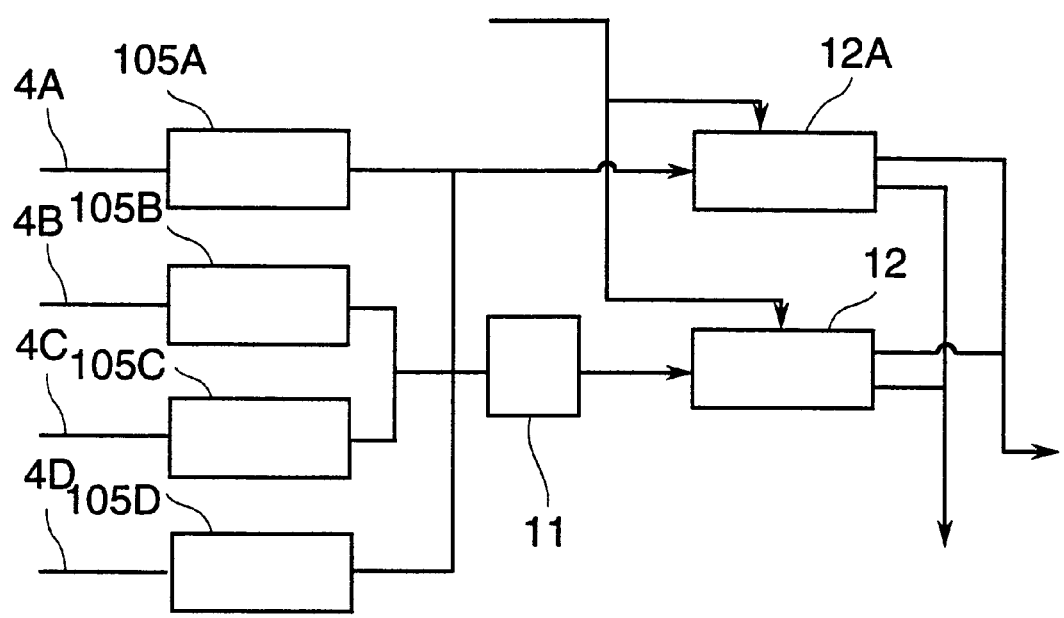
FIG. 12 is a circuit diagram showing a further different modification of FIG. 9.

The embodiment has such an arrangement that each of the liquid materials A, B and C is joined and passed through the mixer 11 and then vaporized by the vaporizer 12. However, the unit may have such a different arrangement that each of the vaporizers 12A, 12B and 12C is arranged downstream of the pumps 10A, 10B and 10C respectively. Then each of the liquid materials A, B and C is vaporized by the vaporizer 12A, 12B or 12C respectively, and gathered to be supplied to the mixer 11 and then mixed by the mixer 11 as shown in FIG. 11. In accordance with the arrangement, the condition of vaporization can be set to each of liquid materials A, B and C respectively, the liquid materials A, B and C can be vaporized under the optimum condition so that appropriate mixed gas can be provided with the CVD reactor 1. If the characteristics of some of the liquid materials are almost the same, these liquid materials may share a common vaporizer. FIG. 12 is a modification of the combination of FIG. 1 and FIG. 11 and shows a case where the condition of vaporization of the liquid material B is almost the same as that of the liquid material C. The invention also includes the above-mentioned arrangement.

A mass flow controller may be used instead of the pumps 105A, 105B, 105C and 105D. The mass flow controller calibrates the liquid flow with a flow sensor.

The Third Embodiment

This embodiment shows a concrete example which is useful when applied to the vaporizing means of the first and the second embodiments.

The vaporizing means 201 has such an arrangement that an ultrasonic sprayer 205 is integrated with a vaporizer 206 and formed by a tube-shaped hollow body 202, an upper cover 203 connected to the top of the body 202 with a bolt and a bottom cover 204 connected to the the bottom of the body 202 with a bolt. At the center of the bottom cover 204 provided are a liquid material introducing pipe 214 which is connected to a liquid storage installed outside of the vaporizing means 201 (omitted to show in the drawings) and which supplies liquid material M and the ultrasonic sprayer 205 which sprays the liquid material M supplied through the liquid material introducing pipe 214. Inside the body 202 provided is the vaporizer 206 which heats and vaporizes the liquid material M sprayed by the ultrasonic sprayer 205. Then the liquid material M vaporized by the vaporizer 206 is supplied to the CVD film formation unit (omitted to show in the drawings) installed outside the top of the vaporizing means 201. The body 202 is provided with a gas introducing pipe 219 penetrating the bottom cover 204 and connected through the body 202 in order to introduce carrier gas X to the body 202 and a gas discharging pipe 220 penetrating the upper cover 203 from inside the body 202 and connected through the CVD film formation unit. Then the vaporized material M is supplied together with the carrier gas X to the CVD film formation unit.

Next each of the arrangements will be described.

The ultrasonic sprayer 205 comprises an ultrasonic vibrator 207 which sprays the liquid material M by means of vibration when voltage is applied, a vibrating plate 208 attached to the top surface of the ultrasonic vibrator 207 and a cooling means 209 indirectly cools heat from the ultrasonic vibrator 207 through the vibrating plate 208.

The ultrasonic vibrator 207 is to generate vibration when alternating voltage of an ultrasonic area is applied to a piezoelectric element mounted on the top of a holder 210 serving as an electrode.

The vibrating plate 208 is a plate having a characteristics of chemical resistant to the liquid material M and thermal conductivity to indirectly cool the ultrasonic vibrator 207 through a cooling means 209. In this embodiment the vibrating plate 208 is made of stainless steel.

The cooling means 209 comprises a cooling water jacket 212 installed under the vibrating plate 208 to surround the holder 210 and a cooling water pipe 213 which introduces cooling water from a cooling water tank (omitted to show in the drawings) installed outside of the vaporization means 201 to the cooling water jacket 212, circulates the cooling water in the cooling water jacket 212 and discharges the cooling water to the cooling water tank.

The vaporizer 206 comprises a heating element 216 accommodated in the body 202, a side heater 217 installed to surround the heating element 216, a top heater 218 installed top of the heating element 216 and an external heater 215 installed to surround the body 202 and top surface of the top cover 203 to heat inside the body 202.

The heating element 216 is a hat shape with its lower end open made of porous sintered stainless steel and inside of which is a heated space Si to be heated by the side heater 217 and the top heater 218. The heating element 216 is made to have a wide surface area in order to deposit the liquid material M sprayed by the ultrasonic sprayer 205 over a wide area as much as possible. Between an inner wall 202a of the body 202 and an outer wall 216a of the heating element 216 provided is a heated space S2 heated by the side heater 217, the top heater 218 and the external heater 215 so as to prevent the liquid material M passing through the heating element 216 from being liquidized again.

Figure 13:
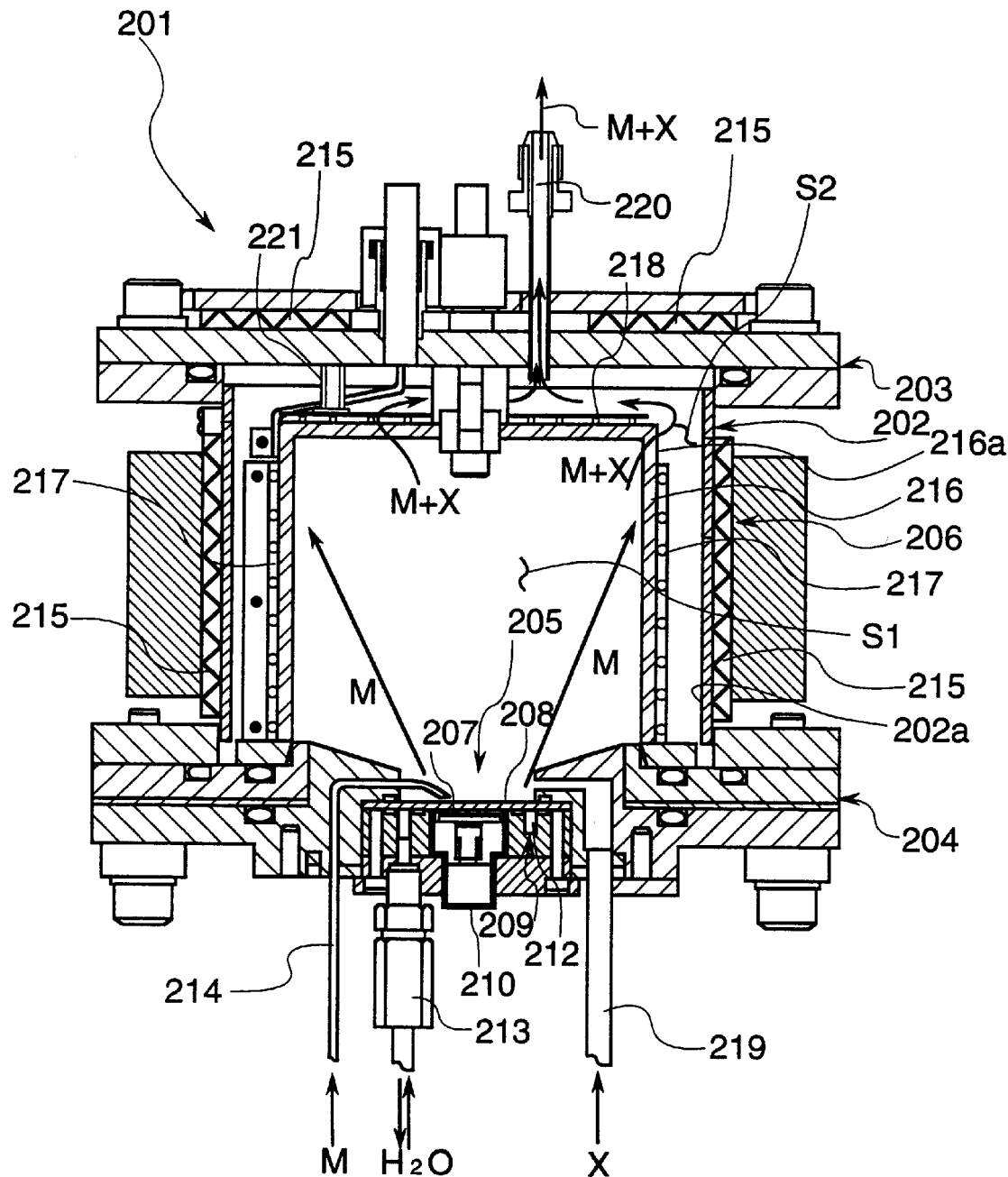
FIG. 13 is a cross-sectional view showing a vaporizing means in accordance with the third embodiment of the invention.

The reference number of 221 in FIG. 13 represents a pair of thermocouple to measure and adjust temperature in the body 202.

Operation of the embodiment will now be explained.

As shown in FIG. 13 the liquid material M corresponds to the mixed liquid of the liquid material A, B and C and the solvent D in the first and the second embodiments. The liquid material M is dropped on the vibrating plate 208 through the liquid material introducing pipe 214. Since the back surface of the vibrating plate 208 is adhered to the upper face of the ultrasonic vibrator 207, the vibration generated by the ultrasonic vibrator 207 is transferred to the liquid material M through the vibrating plate 208 and then the liquid material M is sprayed. The sprayed liquid material M diffuses in the heated space S1 as shown by the arrow in FIG. 13 and uniformly adheres to the inner wall of the heating element 216 and then is heated so as to vaporize. The vaporized liquid material M passes through the heating element 216 together with the carrier gas X which is introduced into the heated space S1 through the gas introducing pipe 219. Since the heating element 216 is porous, passing through the heating element 216 is like being filtered. Then the liquid material M after passing through the heating element 216 diffuses in the heating space S2 in a state of uniform gaseous particles. And after the vaporized liquid material M passes through the gas discharging pipe 220, the liquid material M is supplied to the CVD film formation unit with its temperature kept in an effective value so as to prevent reliquidization.

During operation a large amount of heat is generated by the ultrasonic vibrator 207 and the heat is cooled indirectly by the the cooling water jacket 212 through the vibrating plate 208.

In accordance with the arrangement, since the liquid material M is supplied to the vaporizer 206 after being sprayed by the ultrasonic vibrator 207, the liquid material M can be uniformly sprinkled in a wide range. As a result, it is effectively prevented that the temperature of the vaporizer 206 drops off because the liquid material M adheres densely to a small area, which makes it possible to vaporize a large amount of the liquid material M. In addition, with the ultrasonic sprayer 205 according to the embodiment, a little amount of the liquid material M can effectively be sprayed.

Further, since the ultrasonic vibrator 207 is provided with the vibrating plate 208 on the upper face thereof to avoid dropping the liquid material M directly on the ultrasonic vibrator 207, the ultrasonic vibrator 207 is not touched by the liquid material M. As a result, the material of which the ultrasonic vibrator 207 is made is not affected by the liquid material M and the ultrasonic vibrator 207 is effectively prevented from getting damaged by the liquid material M.

Since the ultrasonic sprayer 205 is arranged away from the heated spaces S1 and S2, the ultrasonic vibrator 207 is effectively protected from the heat.

Since the vaporizer 206 is porous and has a function of filter, the liquid material M is supplied to the CVD film formation unit in a condition of uniform gaseous particle.

Figure 14:
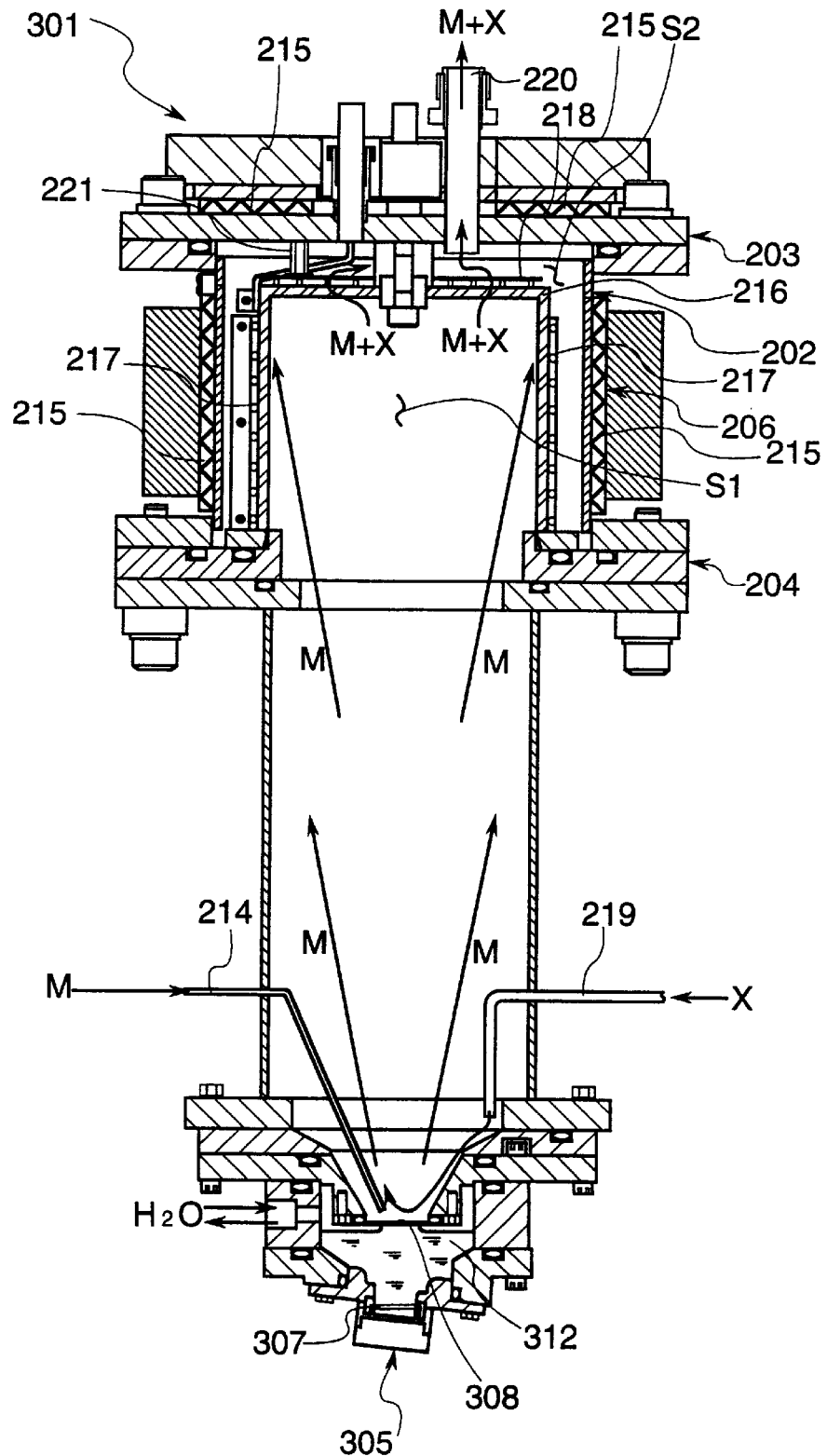
FIG. 14 is a cross-sectional view showing a modification of FIG. 13.

FIG. 14 shows a modification of the third embodiment.

The unit for vaporizing liquid materials 301 has the same arrangement as that of the third embodiment except for that of an ultrasonic sprayer 305. The ultrasonic sprayer 305 has such an arrangement that an ultrasonic vibrator 307 is arranged in a tank 312 for cooling water and a partition 308 made of stainless steel is provided over the tank 312 so as to transfer ultrasonic wave generated by the ultrasonic vibrator 307 to the partition 308 through cooling water for cooling and transferring ultrasonic wave and the liquid material M is sprayed. The sprayed liquid material M uniformly adheres to the surface of a heating element 316 and then is heated, vaporized and supplied to the CVD film formation unit as the same as the first embodiment. In accordance with the arrangement, since the sprayed liquid material M diffuses upward very vigorously, it is effective to arrange the ultrasonic sprayer 305 far from the vaporizer 206 as shown in FIG. 14. The liquid to cool the ultrasonic vibrator 307 and transfer the ultrasonic wave is not limited to water.

The Forth Embodiment

Figure 15:
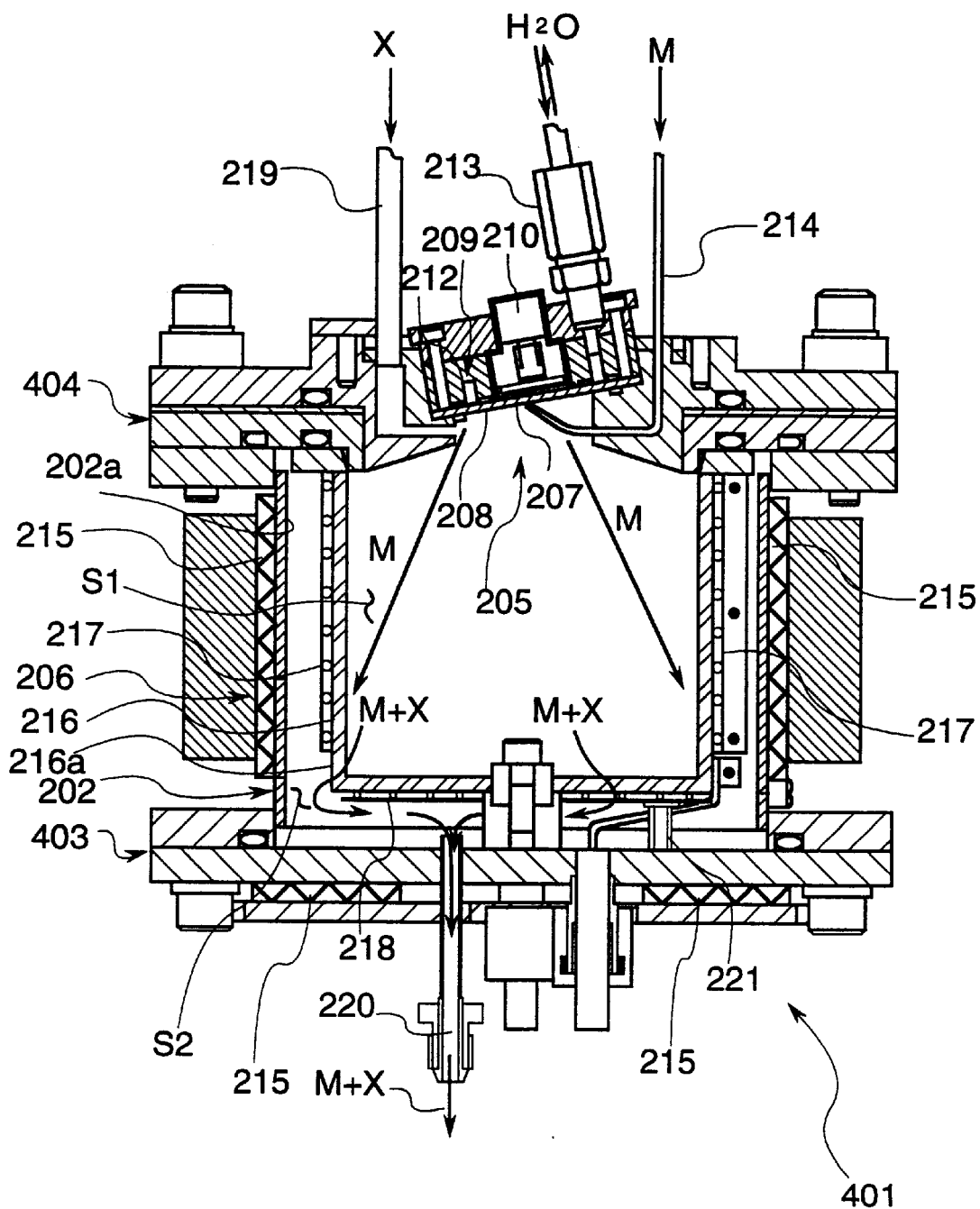
FIG. 15 is a cross-sectional view showing a vaporizing means in accordance with the forth embodiment of the invention.

A vaporizing means shown in FIG. 15 shows a modification of the vaporizing means of the third embodiment.

A vaporizing means 401 is so arranged that the vaporizing means 201 shown in FIG. 13 is arranged upside down so as to set the ultrasonic sprayer 205 and the carrier gas introducing pipe 219 as a carrier gas introducing means over the vaporizer 206.

The arrangement of the vaporizing means 401 will now be explained with reference to the FIG. 15. As the arrangements are essentially the same as those of FIG. 13, the same reference number is given to the same element in the drawings and no description will be given.

The vaporizing means 401 comprises a tube-shaped hollow body 202, an upper cover 404 connected to the top of the body 202 with a bolt and a bottom cover 403 connected to the the bottom of the body 202 with a bolt. At the center of the upper cover 404 provided are a liquid material introducing pipe 214 which is connected to a liquid storage (omitted to show in the drawings) installed outside of the vaporizing means 401 and which supplies liquid material M to the body 202, an ultrasonic sprayer 205 which sprays the liquid material M supplied through the liquid material introducing pipe 214, a gas introducing pipe 219 passing through the upper cover 404 and introducing carrier gas X to the body 202 and the gas introducing pipe 219 passing through the upper cover 404 and connected to the body 202 so as to introduce the carrier gas X inside the body 202. The ultrasonic sprayer 205 has the same arrangement as that of the third embodiment and is arranged a little inclined to an opening of the liquid material introducing pipe 214 to make it easier to transfer the liquid material M supplied by the liquid material introducing pipe 214 to the vibrating plate 208. Under the ultrasonic sprayer 205 provided is the vaporizer 206 which heats and vaporizes the liquid material M sprayed by the ultrasonic sprayer 205. Then the liquid material M vaporized by the vaporizer 206 is supplied to the CVD film formation unit (omitted to show in the drawings) installed outside the vaporizing means 401. The body 202 is provided with a gas discharging pipe 220 penetrating the bottom cover 403 from inside the body 202 and connected through the CVD film formation unit so as to supply the vaporized liquid material M together with the carrier gas X to the CVD film formation unit.

In accordance with the invention, the liquid material M sprayed by the ultrasonic sprayer 205 moves downward together with the carrier gas X introduced to the body 202 through the gas introducing pipe 219 due to gravity so as to be conveyed to the vaporizer 206. As a result, the arrangement of this embodiment can reduce the amount of the carrier gas X in comparison with an arrangement where the ultrasonic sprayer 205 is arranged under the vaporizer 206. The concentration of the liquid material M in gas to be supplied to the CVD film formation unit can be made high, thereby to speed up the velocity of film formation for semiconductor. In addition, since the overall amount of the gas supplied to the CVD film formation unit can be reduced, a load of vacuuming in the CVD film formation unit can be decreased and a size of the vacuum pump can be downsized. Even if a flow of the liquid material M supplied to the CVD film formation unit is to be increased or decreased, there is no need of changing the flow of the carrier gas X and the flow can be maintained generally at the same value. As a result, it becomes easy to set a parameter of the flow of the the liquid material M and the flow of the carrier gas X.

Next a modification of FIG. 15 will be explained with reference to FIG. 16.

Figure 16:
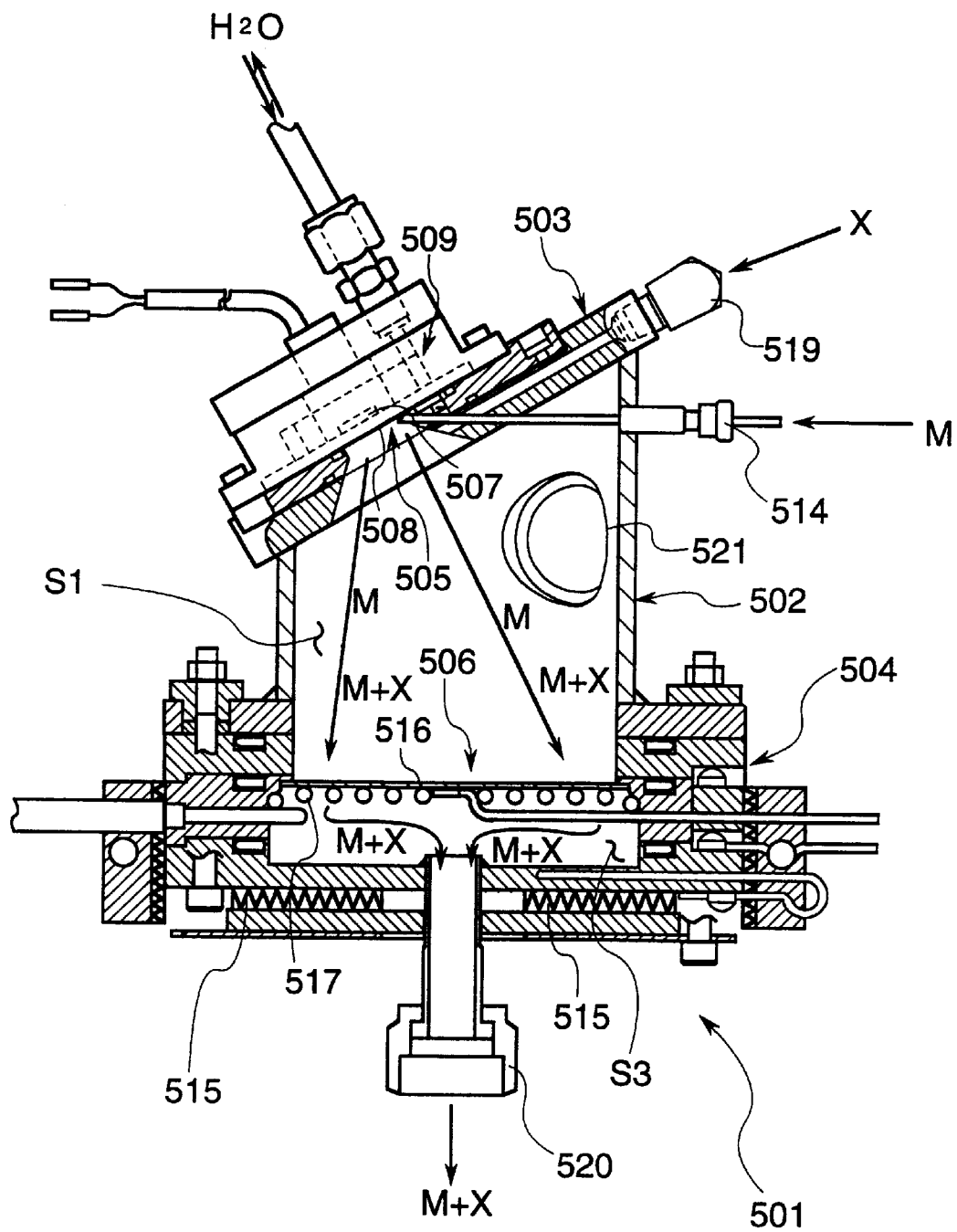
FIG. 16 is a cross-sectional view showing a modification of FIG. 15.
Figure 17:
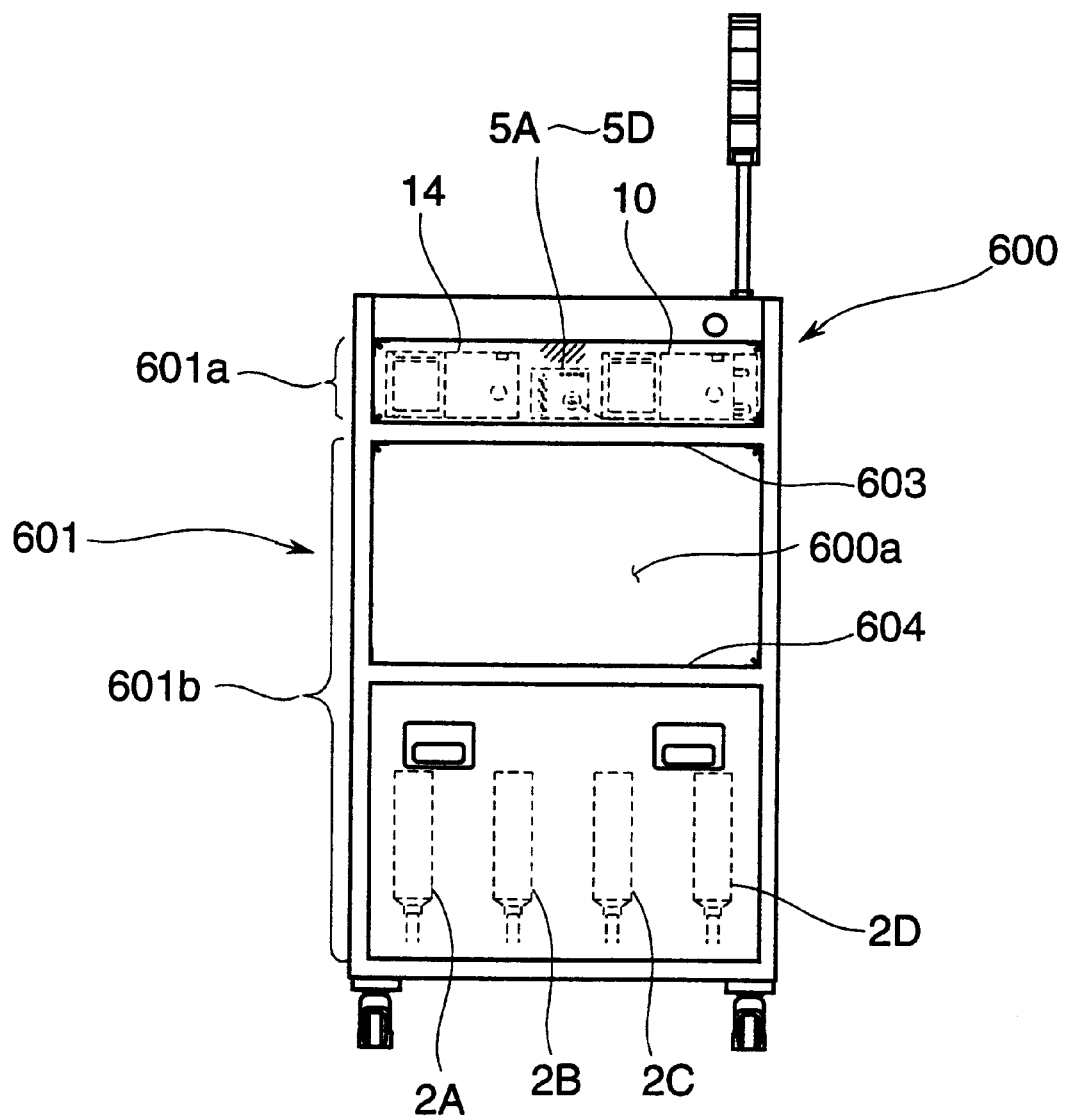
FIG. 17 is a front view showing a unit structure of a vaporizing means in accordance with the fifth embodiment of the invention.
Figure 18:
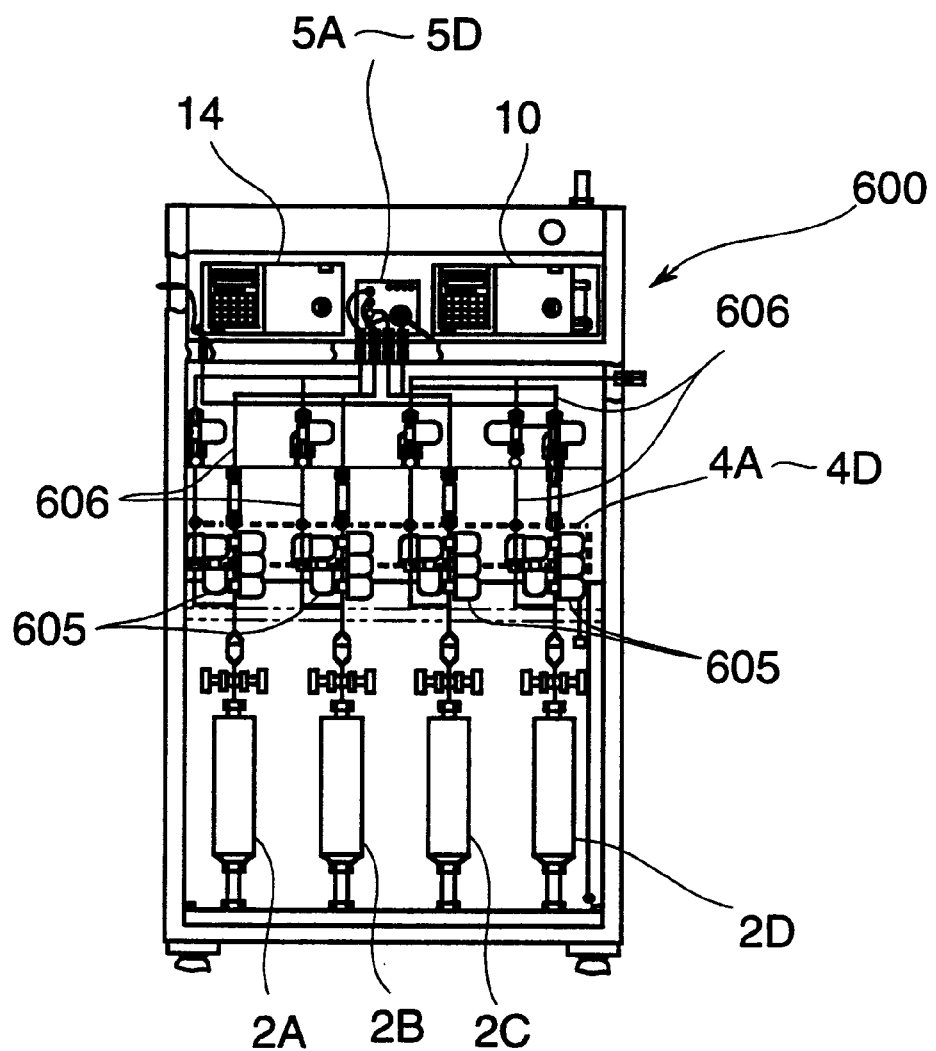
FIG. 18 is an explanatory view showing an internal structure with a front panel removed in FIG. 17.
Figure 19:
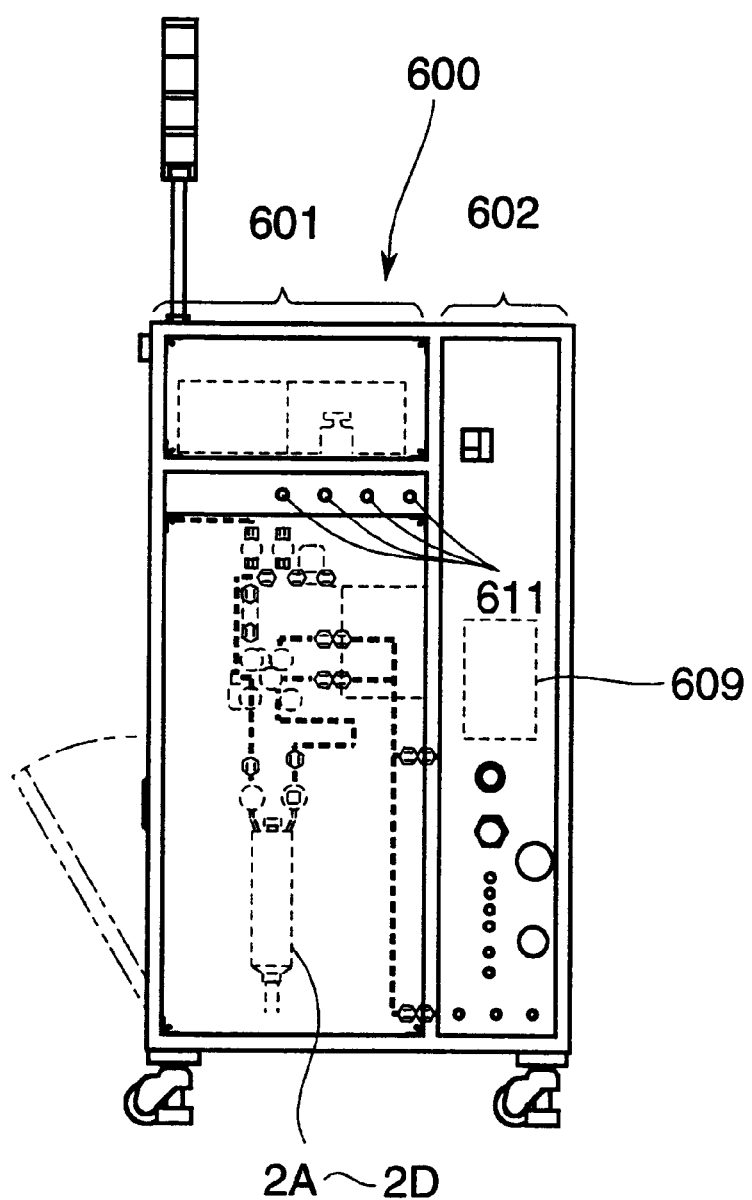
FIG. 19 is a right side view of FIG. 17.
Figure 20:
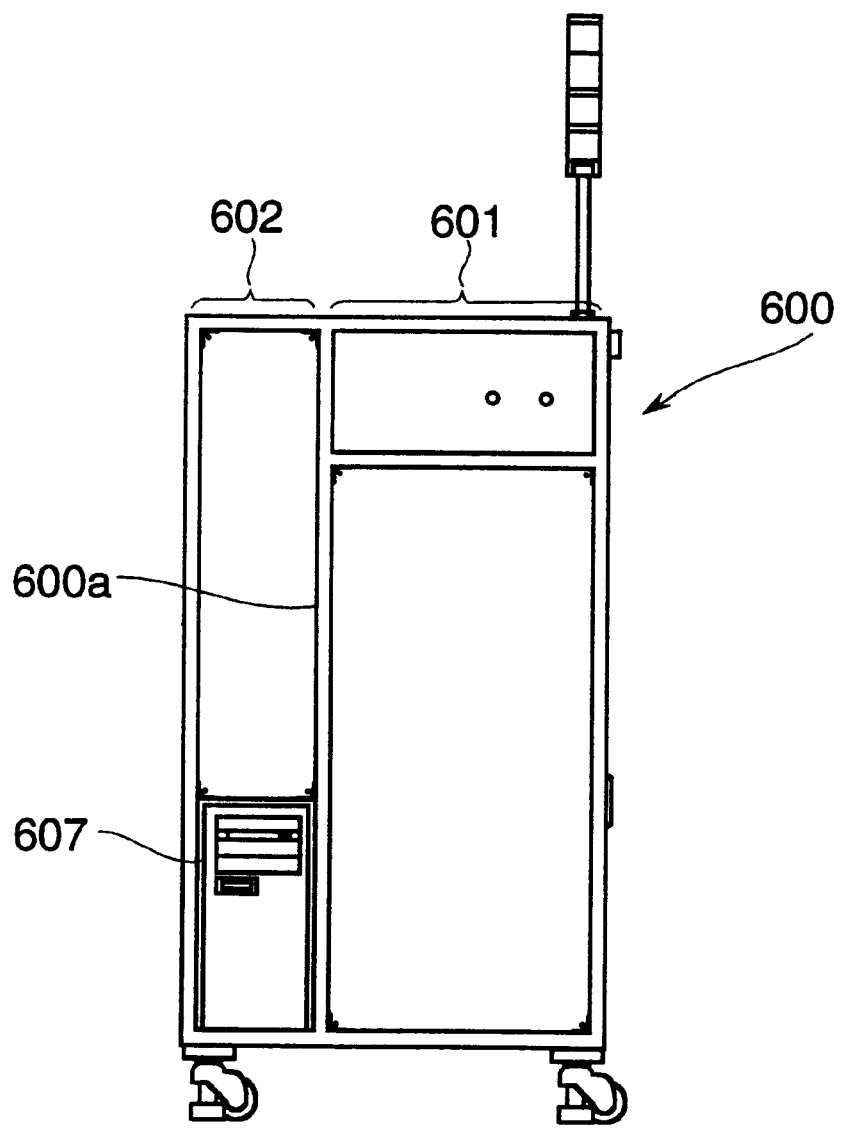
FIG. 20 is a left side view of FIG. 9.
Figure 21:
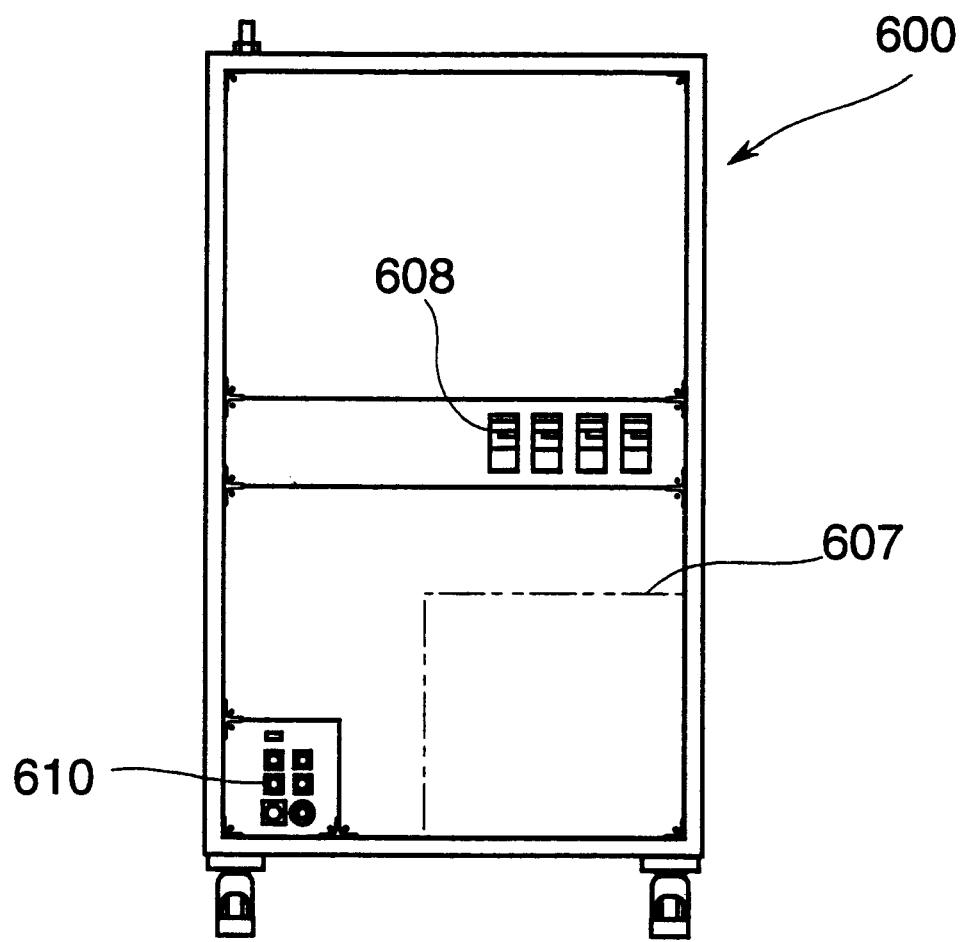
FIG. 21 is a back view of FIG. 9.

A vaporizing means 501 shown in FIG. 16 has such an arrangement that an ultrasonic sprayer 505 and a carrier gas introducing pipe 519 are arranged upside of a vaporizer 506.

More concretely, the vaporizing means 501 comprises a body 502 made of a-single hollow tube-shaped pipe, an upper cover 503 connected to the top of the body 502 inclined to the body 502 with a bolt and a bottom cover 504 connected to the bottom of the body 502 with a bolt. The body 502 is provided with a peep window 521 for visual inspection of the sprayed the liquid material M from outside. At the center of the upper cover 503 provided are a liquid material introducing pipe 514 which is connected to a liquid storage (omitted to show in the drawings) installed outside of the vaporizing means 501 and which supplies the liquid material M to the body 502, an ultrasonic sprayer 505 which sprays the liquid material M supplied through the liquid material introducing pipe 514, and a gas introducing pipe 519 passing through the upper cover 503 and connected to the body 502 so as to introduce the carrier gas X inside the body 502. The ultrasonic sprayer 505 has the same arrangement as that of FIGS. 13 and 15 and comprises an ultrasonic vibrator 507 which sprays the liquid material M by means of vibration when voltage is applied, a vibrating plate 508 attached to the top surface of the ultrasonic vibrator 507 and a cooling means 509 indirectly cools heat from the ultrasonic vibrator 507 through the vibrating plate 508. The ultrasonic sprayer 505 is arranged a little inclined to the opening of the liquid material introducing pipe 514 to make it easier to transfer the liquid material M supplied through the liquid material introducing pipe 514 to the vibrating plate 508. Under the body 502, namely, in the bottom cover 504 provided is the vaporizer 506 which heats and vaporizes the liquid material M sprayed by the ultrasonic sprayer 505. The vaporizer 506 vaporizes the liquid material M and supplies the vaporized liquid material M to the CVD film formation unit (omitted to show in the drawings) provided outside the vaporizing means 501. More specifically, the vaporizer 506 comprises a plate-shaped heating element,516 arranged on the bottom of the body 502, a bottom heater 517 arranged on the bottom of the heating element 516 to heat the heating element 516 and the external heater 515 arranged in the bottom cover 504. The heating element 516 is a mesh-structured plate made of a material having a good thermal transfer efficiency and heats a space S3 formed among the heating element 516, the bottom heater 517 and the external heater 515. At the bottom of the body 502 provided is a gas discharging pipe 520 penetrating the bottom cover 504 from inside the body 502 and connected through the CVD film formation unit so as to supply the vaporized material M together with the carrier gas X to the CVD film formation unit.

In accordance with the arrangement, the sprayed liquid material M can be conveyed to the vaporizer 506 by means of not only an energy of the carrier gas X but also gravity. In addition, since the body 502 is provided with the peep window 521, the liquid material M can be visually inspected from outside. Since the liquid material M can be transferred from upward to downward by means of gravity, the vaporizer 506 can be a shape of a flat plate and installed in the bottom of the body 502. Then the body 502 can be made of a single tube so that the arrangement of the unit is simple, thereby to simplify the operation of assembling or disassembling the unit.

In this embodiment the ultrasonic sprayers 205, 505 are tilted to make it easy to transfer the liquid material M to the vibrating plates 208, 508, however, it depends on the characteristics of the liquid material M such as viscosity, surface tension or interfacial tension. Whether the ultrasonic sprayer is tilted or not, or the angle at which the ultrasonic sprayer is tilted is not limited to the embodiment and may be varied within the spirit of the invention. The material of which the vibrating plate 208, 508 and the partition 308 shown in FIGS. 13 to 16 are made is stainless steel, however, it may be any material such as MO, W, SiC or lamination of Al and $SiO_2$, or Cu and $SiO_2$ as far as there is no problem concerning chemical resistance and thermal transmission to the liquid material M.

The arrangement of the cooling means is not limited to the above embodiment and may be a holder of the electrode in which cooling water is circulated.

In the embodiment shown in FIGS. 13 through 16 if the heating space is preheated by the vaporizer prior to introducing carrier gas X, the vaporizing efficiency of the liquid material M can be further improved.

The Fifth Embodiment

The embodiment shown in FIG. 17 through FIG. 21 shows a state that each of the elements which constitutes the first embodiment is incorporated in a common trestle 600.

The trestle 600 is a hollow box and divided into two areas by a partition 600a, one of which is a liquid conveying area 601 locating in a front side and the other of which is a controlling area 602 locating in a back side. The liquid conveying area 601 is further divided into an upper area 601a and a lower area 601b by a shelf 603. The reference number of 604 represents a cross support for mounting a panel or the like and different from the one which divides the lower area 601 into two areas. In the lower part of the lower area 601b provided are the containers 2A, 2B and 2C and the container for solvent 2D. Pipes 606 with stop valves 605 as liquid conveying lines 4A, 4B, 4C and 4D are vertically arranged in the lower part of the lower area 601b. In the upper area 601a provided are a pump 10, proportional valves 5A, 5B, 5C and 5D and an auxiliary pump 14 as a conveying means. In the controlling area 602 provided is a CPU unit 607 as a controlling means for controlling the pumps 10, 14, the proportional valves 5A, 5B, 5C and 5D and the stop valve 605. The reference number of 608 represents a heater controller for controlling the vaporizer 12 or the heater H arranged near the vaporizer 12 (refer to FIG. 1), the reference number of 610 represents a heater connecting port, the reference number of 611 represents an external supply line connecting port, and the reference number of 609 represents a solenoid valve. The proportional valves 5A, 5B, 5C and 5D and the stop valve 605 are switched by controlling the solenoid valve 609 by means of the CPU unit 607. The vaporizer 12 is not installed on the trestle 600 and is arranged to separate from the trestle 600. The vaporizer 12 is arranged near a reaction vessel of the CVD reactor 1 as much as possible. It is most preferable if the vaporizer 12 can directly be mounted on a gas supplying portion of the reaction vessel.

In accordance with the arrangement, the containers 2A, 2B and 2C arranged in the lower area 601b of the trestle 600 and the pump 10 and the proportional valves 5A, 5B, 5C and 5D as the conveying means arranged in the upper area 601a are connected by the vertically extending liquid conveying lines 4A, 4B, 4C and 4D. As a result, if there may exist air bubbles in the liquid material M introduced from the containers 2A, 2B and 2C, the air bubbles naturally go upward and can be discharged from the liquid conveying lines 4A, 4B, 4C and 4D, so that the air bubbles do not to stay in pipes or valves. This can effectively prevent deterioration in the efficiency of conveying liquid.

Since the vaporizer 12 is arranged close to the reacting vessel and away from the trestle 600 as much as possible, the vaporized gas can be conveyed quickly to the reacting vessel and the heating area after vaporization can be made small. This makes it possible to supply vaporized gas stably and to simplify the structure.

In accordance with the embodiment, following effects are produced in addition to the above effects.

Generally the containers 2A, 2B and 2C are made of stainless steel and filled with liquid material, so that the containers 2A, 2B and 2C filled with liquid material become very heavy. In this embodiment since the heavy containers 2A, 2B and 2C are arranged in the lower area 601b of the trestle 600 and relatively light pump 10 is arranged in the upper area 601a, it becomes easy to mount or dismount the containers 2A, 2B and 2C and the trestle 600 becomes stable due to a low center of gravity. If liquid leakage may happen in the liquid conveying lines 4A, 4B, 4C and 4D under the pump 10, it is effectively prevented from inflammability because the stop valve 605 is an air-pressure type and the solenoid valve 609 which controls the air-pressure is arranged in the controlling area 602 locating in the back of the trestle 600, thereby to effectively improve safety of the unit.

As mentioned above, in accordance with the embodiment, whole of the unit is easy to handle because all of the elements are arranged in a single unit structure. In addition, with the vaporizing means, effective liquid conveying performance and a good characteristic of film formation are obtained.

The Sixth Embodiment

The embodiment shows a concrete example of a plunger pump which is useful for applying the first and the second embodiments.

Figure 22:
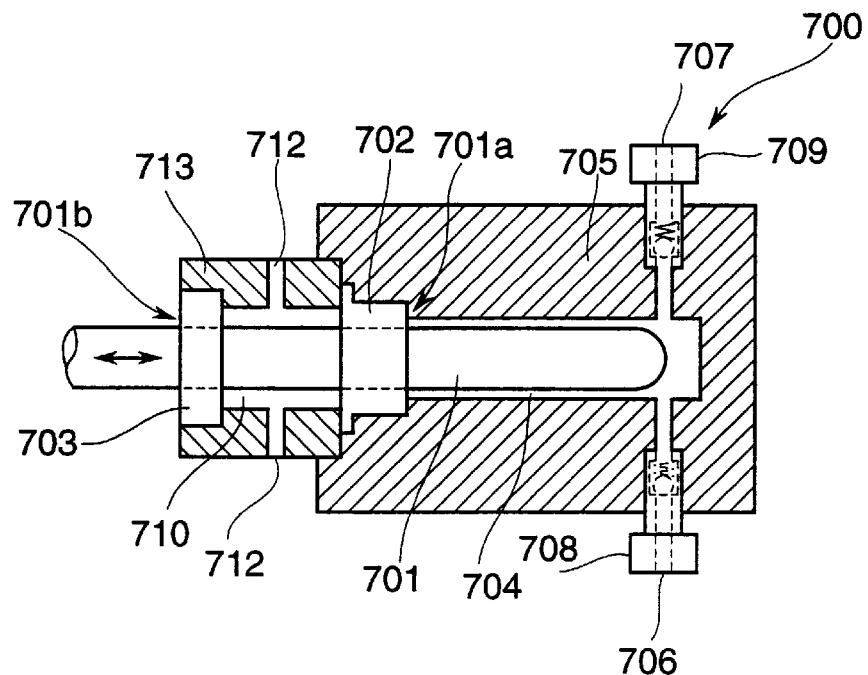
FIG. 22 is a schematic cross-sectional view of a plunger pump in accordance with the sixth embodiment of the invention.

The plunger pump 700 is, as shown in FIG. 22, given a piston motion by a driving source (omitted to show in the drawings) which is arranged left of the plunger pump 700. A plunger 701 makes a reciprocating motion toward right and left in FIG. 22 with moving slidably to two plunger seal 702 and 703. A tip of the plunger 701 is in a pump chamber 704. The pump chamber 704 is a hole made in a pump head 705. Since an internal volume of the pump chamber 704 changes with the reciprocating motion of the plunger 701, the liquid material is conveyed in one direction (from the bottom to the top in FIG. 22) with the operation of check valves 708 and 709 arranged in an inlet 706 and an outlet 707. In other word, a pumping effect is generated.

When the plunger 701 moves toward the right direction in FIG. 22, the liquid is discharged. When the plunger 701 moves toward the left, the liquid is inhaled. In order to avoid halt of inhaling the liquid during a process of moving right and left, there is a double plunger type where a pair of the plunger pumps having the same structure are arranged in parallel and each of the phases of the plunger is shifted 180 degrees. The invention may be applied to a double plunger type. However, to make the explanation simple, a single plunger type will be explained.

The plunger seal 702 permits the plunger 701 to move along axis and seals the liquid material in the pump chamber 704. The plunger seal 702 does not perfectly seal the liquid material but a little of the liquid material flows out to the backward of the plunger seal 702 (left in FIG. 22) so as to moisten the surface of the plunger 701 for lubricating the plunger seal 702 and the plunger 701. When the liquid material flowing out of the plunger seal 702 is exposed to air, the liquid material produces a solid product. The solid product might be caught between the plunger 701 and the plunger seal 702 with the movement of the plunger 701, which may lead to abrasion of the sliding portion of the plunger 701. However, in the embodiment shown in FIG. 22, a second plunger seal 703 is arranged behind the plunger seal 702 separated at a distance of much more than a range of the reciprocating motion. And a liquid tightly closed small chamber (cleaning chamber 710) as a flow channel for flowing cleaning liquid is formed between the plunger seal 702 and the second plunger seal 703. The small chamber 710 is covered with a housing 713 having an inlet and outlet 712 for cleaning liquid. The cleaning chamber 710 is filled with cleaning liquid, which cleans liquid materials or products on the sliding surface of the plunger 701.

The cleaning liquid always runs by means of a pump (omitted to show in the drawings) provided outside. For economic reason the cleaning liquid may be circulated in the cleaning chamber introduced from a vessel provided outside and the cleaning liquid may periodically be exchanged. Or a valve is provided in an inlet and outlet for cleaning liquid and the cleaning liquid is sealed in the cleaning chamber and periodically the cleaning liquid is exchanged by means of a syringe with hand. The cleaning liquid is preferably the same or the same kind of the solvent used for the liquid material.

With the structure of the embodiment, no product is produced on the sliding surface of the plunger or the product generated by any chance can quickly be removed. As a result, abrasion of the plunger and a liquid sealing mechanism which moves slidably to the plunger can be reduced, thereby to improve durability.

The plunger 701 is generally made of a ruby or a sapphire to get high strength, hardness, corrosion resistance and abrasion resistance. The sliding portions 701a and 701b of the plunger 701 are sealed by the plunger seal 702 arranged in the liquid conveying side and the plunger seal 703 arranged in the atmosphere side. A seal structure shown in FIG. 23 is effective to improve the effect of sealing.

Figure 23:
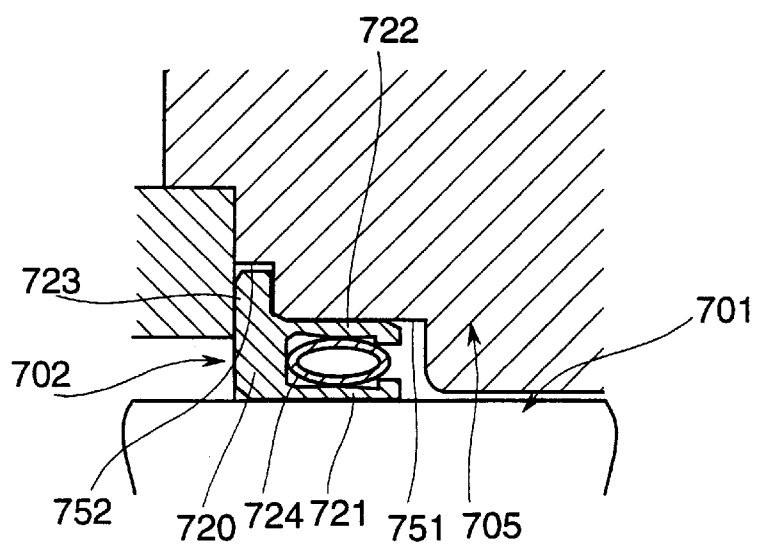
FIG. 23 is an enlarged view showing an essential part of FIG. 9.

FIG. 23 shows an example of the plunger seal 702 in the liquid conveying side. A first groove 751 is formed along internal circumference of the pump head 705 and a second groove 752 which is deeper than the first groove 751 is formed between the first groove 751 and the circumference of the pump head 705. The seal material 720 comprises a seal lip 721, a spring clip 722 both of which are to be inserted into the first groove 751, and a body 723 whose base end is integrally connected to the seal lip 721 and the spring clip 722 and whose tip end is to be inserted into the second groove 752. The body 723 is inserted into the second groove 752 and both of the seal lip 721 and the spring clip 722 are inserted into the first groove 751 with a coil spring 724 arranged between the seal lip 721 and the spring clip 722.

The seal lip 721 is pushed against the circumference of the plunger 701 by setting an elasticity force of the coil spring 724 at such a value that a liquid material leaks little by little.

In this embodiment the seal material 720 is made of polytetrafluoroethylene (PTFE) with carbon fibrous material.

When the plunger pump 700 with the seal of the above-mentioned arrangement is operated in the vaporizing means, a liquid around the plunger seal 702 goes into a space between the plunger 701 and the seal lip 721, thereby to get lubrication. In case the liquid has a low viscosity, the elasticity of the coil spring 724 should be set appropriately and the seal material 720 should be made of polytetrafluoroethylene with carbon fibrous material. Then the coefficient of friction will not conspicuously become high. If a seal material 720 is made of Polytetrafluoroethylene, it is very likely to happen that worn seal material is pushed to go into a space between the plunger and the seal lip by means of liquid pressure in the early stage of initial operation, namely, while the seal lip is loosely inserted. As a result, with the arrangement, a problem of leakage in a short term can be resolved.

In addition, the seal material 720 in accordance with the embodiment is made of polytetrafluoroethylene integrally inclusive of carbon fibrous material. Then if the seal material 720 is used for the sliding portion 701a of the plunger 701, carbon will not easily be stripped in a short term like the one in which carbon is just mixed with polytetrafluoroethylene. As a result, progress of abrasion is effectively inhibited and it is possible to maintain an effect of sealing in a long term if the seal material 720 is used for a seal means of the plunger 701 like the embodiment which deals with liquid material easy to produce solid product.

In this embodiment, a pair of the plunger seals are arranged in line to prevent progress of abrasion by the product of the plunger seal. Here is explained the case where the seal material in accordance with the invention is applied only to the liquid conveying side, however, it is possible to apply the seal material of the invention to a seal of cleaning side. In addition, the same operation and effects can be obtained if the seal material of the invention is applied to a pump whose one side is exposed to atmosphere without a double seal structure.

POSSIBLE APPLICATIONS IN INDUSTRY

As explained in detail hereinabove, the unit for vaporizing liquid materials of the invention is suitable for applying to a semiconductor manufacturing unit and is used to supply a liquid material for forming a thin film on a base.

What is claimed is:

1. A unit for vaporizing liquid materials which is used for depositing the materials or a substrate comprising a plurality of containers each of which contains a different liquid material which is made by dissolving a material into a solvent, a container exclusive for solvent which contains the same or the same kind of solvent used for the liquid materials, a liquid conveying means which conveys the liquid materials from the containers and the solvent from the container exclusive for solvent for mixing together in the liquid state, and a vaporizing means which sprays the liquid materials and the solvent conveyed by the liquid conveying means and deposits the sprayed liquid materials and the solvent on a substrate.

2. A unit for vaporizing liquid materials as described in claim 1 wherein every one of the containers and the container exclusive for solvent has the liquid conveying means and a mixing rate of the liquid materials and the solvent is controlled by the liquid conveying means.

3. A unit for vaporizing liquid materials as described in claim 1 wherein the liquid materials and the solvent are conveyed from the containers and the container exclusive for solvent by a single liquid conveying means.

4. A unit for vaporizing liquid materials as described in claim 1, 2 or 3 wherein the vaporizing means comprises an ultrasonic sprayer and a vaporizer.

5. A unit for vaporizing liquid materials as described in claim 1, 2, or 3 wherein the containers and the container exclusive for solvent are arranged below the liquid conveying means.

6. A unit for vaporizing liquid materials as described in claim 1, 2, or 3 wherein the liquid conveying means is a plunger pump and a flow channel for flowing a cleaning solvent is provided in a sliding portion of the plunger.

7. A unit for vaporizing liquid materials as described in claim 6 wherein a seal for sealing the plunger is made of polytetrafluoroethylene containing carbon fiber.

* * * * *